United States Patent
Amano et al.

(10) Patent No.: US 11,107,432 B2
(45) Date of Patent: Aug. 31, 2021

(54) PULSE OUTPUT CIRCUIT, SHIFT REGISTER, AND DISPLAY DEVICE

(71) Applicant: Semiconductor Energy Laboratory Co., Ltd., Atsugi (JP)

(72) Inventors: Seiko Amano, Kanagawa (JP); Hiroyuki Miyake, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 17/073,634

(22) Filed: Oct. 19, 2020

(65) Prior Publication Data
US 2021/0056923 A1 Feb. 25, 2021

Related U.S. Application Data

(63) Continuation of application No. 15/393,389, filed on Dec. 29, 2016, now Pat. No. 10,818,256, which is a
(Continued)

(30) Foreign Application Priority Data

May 21, 2010 (JP) .............................. JP2010-117615

(51) Int. Cl.
*G09G 3/32* (2016.01)
*G09G 3/36* (2006.01)
(Continued)

(52) U.S. Cl.
CPC ......... *G09G 3/3677* (2013.01); *G06F 1/3265* (2013.01); *G06F 3/038* (2013.01);
(Continued)

(58) Field of Classification Search
None
See application file for complete search history.

(56) References Cited

U.S. PATENT DOCUMENTS 5,973,531 A 10/1999 Kim et al.
6,433,768 B1 8/2002 Miyazawa et al.
(Continued)

FOREIGN PATENT DOCUMENTS

CN 101166023 A 4/2008
EP 1737044 A 12/2006
(Continued)

OTHER PUBLICATIONS

International Search Report (Application No. PCT/JP2011/061465) dated Jul. 5, 2011.
(Continued)

*Primary Examiner* — Krishna P Neupane
(74) *Attorney, Agent, or Firm* — Fish & Richardson P.C.

(57) ABSTRACT

In a pulse output circuit in a shift register, a power source line which is connected to a transistor in an output portion connected to a pulse output circuit at the next stage is set to a low-potential drive voltage, and a power source line which is connected to a transistor in an output portion connected to a scan signal line is set to a variable potential drive voltage. The variable potential drive voltage is the low-potential drive voltage in a normal mode, and can be either a high-potential drive voltage or the low-potential drive voltage in a batch mode. In the batch mode, display scan signals can be output to a plurality of scan signal lines at the same timing in a batch.

3 Claims, 19 Drawing Sheets

Related U.S. Application Data continuation of application No. 14/831,939, filed on Aug. 21, 2015, now Pat. No. 9,543,039, which is a continuation of application No. 13/111,064, filed on May 19, 2011, now Pat. No. 9,117,537.

(51) Int. Cl.

| | | |
|---|---|---|
| *G11C 19/28* | (2006.01) | |
| *G06F 3/038* | (2013.01) | |
| *G09G 3/3266* | (2016.01) | |
| *G06F 1/3234* | (2019.01) | |
| *H01L 27/12* | (2006.01) | |
| *G09G 5/00* | (2006.01) | |

(52) U.S. Cl.
CPC ......... *G09G 3/3266* (2013.01); *G11C 19/28* (2013.01); *H01L 27/124* (2013.01); *G09G 5/008* (2013.01); *G09G 2300/0809* (2013.01); *G09G 2300/0871* (2013.01); *G09G 2310/0205* (2013.01); *G09G 2310/0248* (2013.01); *G09G 2310/0286* (2013.01); *G09G 2310/08* (2013.01); *G09G 2320/0247* (2013.01); *G09G 2330/021* (2013.01)

(56) References Cited

U.S. PATENT DOCUMENTS

| | | | |
|---|---|---|---|
| 6,788,108 | B2 | 9/2004 | Miyake et al. |
| 6,813,332 | B2 | 11/2004 | Nagao et al. |
| 6,845,140 | B2 | 1/2005 | Moon et al. |
| 6,928,136 | B2 | 8/2005 | Nagao et al. |
| 6,975,142 | B2 | 12/2005 | Azami et al. |
| 7,057,598 | B2 | 6/2006 | Azami et al. |
| 7,116,748 | B2 | 10/2006 | Nagao et al. |
| 7,122,969 | B2 | 10/2006 | Fukumoto et al. |
| 7,133,013 | B2 | 11/2006 | Kamezaki et al. |
| 7,151,278 | B2 | 12/2006 | Nagao et al. |
| 7,394,102 | B2 | 7/2008 | Nagao et al. |
| 7,397,885 | B2 | 7/2008 | Moon et al. |
| 7,443,202 | B2 | 10/2008 | Kimura et al. |
| 7,450,681 | B2 | 11/2008 | Wei et al. |
| 7,511,709 | B2 | 3/2009 | Koyama et al. |
| 7,586,478 | B2 | 9/2009 | Azami et al. |
| 7,590,214 | B2 | 9/2009 | Liu et al. |
| 7,656,380 | B2 | 2/2010 | Koyama et al. |
| 7,696,974 | B2 | 4/2010 | Moon et al. |
| 7,738,623 | B2 | 6/2010 | Tobita |
| 7,800,576 | B2 | 9/2010 | Jinta |
| 7,932,888 | B2 | 4/2011 | Miyake |
| 7,949,086 | B2 | 5/2011 | Tsai et al. |
| 8,054,279 | B2 | 11/2011 | Umezaki et al. |
| 8,084,331 | B2 | 12/2011 | Ofuji et al. |
| 8,223,112 | B2 | 7/2012 | Ohkawa et al. |
| 8,269,713 | B2 | 9/2012 | Furuta et al. |
| 8,269,714 | B2 | 9/2012 | Furuta et al. |
| 8,310,473 | B2 | 11/2012 | Jinta |
| 8,384,702 | B2 | 2/2013 | Jinta |
| 8,462,096 | B2 | 6/2013 | Otose |
| 8,493,309 | B2 | 7/2013 | Tobita |
| 8,493,312 | B2 | 7/2013 | Furuta et al. |
| 8,508,459 | B2 | 8/2013 | Miyake |
| 8,743,044 | B2 | 6/2014 | Umezaki et al. |
| 8,766,901 | B2 | 7/2014 | Miyake |
| 8,798,226 | B2 | 8/2014 | Nagao et al. |
| 8,816,949 | B2 | 8/2014 | Tobita |
| 8,836,686 | B2 | 9/2014 | Umezaki et al. |
| 8,902,145 | B2 | 12/2014 | Umezaki et al. |
| 9,024,930 | B2 | 5/2015 | Nagao et al. |
| 9,064,753 | B2 | 6/2015 | Miyake |
| 9,536,903 | B2 | 1/2017 | Umezaki et al. |
| 9,590,632 | B2 | 3/2017 | Nagao et al. |
| 9,842,861 | B2 | 12/2017 | Umezaki et al. |
| 2002/0097208 | A1 | 7/2002 | Hashimoto |
| 2002/0190326 | A1 | 12/2002 | Nagao et al. |
| 2003/0113961 | A1 | 6/2003 | Horiuchi et al. |
| 2004/0104882 | A1 | 6/2004 | Kitani et al. |
| 2004/0164947 | A1 | 8/2004 | Noda |
| 2006/0202940 | A1 | 9/2006 | Azami et al. |
| 2006/0208977 | A1 | 9/2006 | Kimura |
| 2006/0221034 | A1 | 10/2006 | Nakao et al. |
| 2006/0244699 | A1 | 11/2006 | Yamazaki |
| 2006/0280279 | A1 | 12/2006 | Nagao et al. |
| 2006/0291610 | A1 | 12/2006 | Lo et al. |
| 2007/0046608 | A1 | 3/2007 | Chung |
| 2007/0194379 | A1 | 8/2007 | Hosono et al. |
| 2007/0247932 | A1 | 10/2007 | Tobita |
| 2007/0296660 | A1 | 12/2007 | Kimura et al. |
| 2008/0011861 | A1 | 1/2008 | Ikeda et al. |
| 2008/0062112 | A1 | 3/2008 | Umezaki |
| 2008/0079001 | A1 | 4/2008 | Umezaki et al. |
| 2008/0079685 | A1 | 4/2008 | Umezaki et al. |
| 2008/0080661 | A1* | 4/2008 | Tobita ................. G11C 19/28 377/78 |
| 2008/0219401 | A1 | 9/2008 | Tobita |
| 2008/0258998 | A1* | 10/2008 | Miyake ................. H03K 3/36 345/42 |
| 2009/0027083 | A1 | 1/2009 | Kimura et al. |
| 2009/0141004 | A1 | 6/2009 | Yamazaki |
| 2009/0278122 | A1 | 11/2009 | Hosono et al. |
| 2009/0280600 | A1 | 11/2009 | Hosono et al. |
| 2009/0322716 | A1 | 12/2009 | Azami et al. |
| 2010/0102311 | A1 | 4/2010 | Ito et al. |
| 2010/0102312 | A1 | 4/2010 | Yamazaki et al. |
| 2010/0109003 | A1 | 5/2010 | Akimoto et al. |
| 2010/0134476 | A1 | 6/2010 | Zebedee et al. |
| 2010/0134708 | A1 | 6/2010 | Kimura et al. |
| 2010/0163874 | A1 | 7/2010 | Koyama et al. |
| 2010/0321312 | A1 | 12/2010 | Han et al. |
| 2011/0033022 | A1 | 2/2011 | Zebedee et al. |
| 2011/0101352 | A1 | 5/2011 | Hosono et al. |
| 2011/0102310 | A1 | 5/2011 | Chiu et al. |
| 2011/0201162 | A1 | 8/2011 | Hosono et al. |
| 2011/0216874 | A1 | 9/2011 | Toyotaka |
| 2011/0216875 | A1 | 9/2011 | Miyake |
| 2011/0216876 | A1 | 9/2011 | Amano et al. |
| 2012/0001954 | A1 | 1/2012 | Yamazaki et al. |
| 2012/0001955 | A1 | 1/2012 | Yamazaki et al. |
| 2012/0002127 | A1 | 1/2012 | Yamazaki et al. |
| 2012/0012838 | A1 | 1/2012 | Hosono et al. |
| 2013/0154909 | A1 | 6/2013 | Jinta |
| 2017/0243554 | A1 | 8/2017 | Nagao et al. |
| 2018/0158839 | A1 | 6/2018 | Umezaki et al. |

FOREIGN PATENT DOCUMENTS

| | | |
|---|---|---|
| EP | 1906414 A | 4/2008 |
| EP | 2189987 A | 5/2010 |
| EP | 2189988 A | 5/2010 |
| EP | 2226847 A | 9/2010 |
| EP | 2234116 A | 9/2010 |
| EP | 2246894 A | 11/2010 |
| EP | 2413366 A | 2/2012 |
| EP | 3223283 A | 9/2017 |
| GB | 2459661 | 11/2009 |
| JP | 2001-343928 A | 12/2001 |
| JP | 2002-197885 A | 7/2002 |
| JP | 2004-226429 A | 8/2004 |
| JP | 2005-149624 A | 6/2005 |
| JP | 2008-089915 A | 4/2008 |
| JP | 2008-122939 A | 5/2008 |
| JP | 2009-212443 A | 9/2009 |
| JP | 2009-272839 A | 11/2009 |
| JP | 2009-278386 A | 11/2009 |
| JP | 2010-021899 A | 1/2010 |
| JP | 2010-092545 A | 4/2010 |
| JP | 2010-103340 A | 5/2010 |
| JP | 2010-103360 A | 5/2010 |
| JP | 2011-209714 A | 10/2011 |
| JP | 2012-032800 A | 2/2012 |
| JP | 2012-032801 A | 2/2012 |
| JP | 2012-032809 A | 2/2012 |
| JP | 5596619 | 9/2014 |
| KR | 2008-0034808 A | 4/2008 |

(56) References Cited

FOREIGN PATENT DOCUMENTS

| | | |
|---|---|---|
| KR | 2009-0110483 A | 10/2009 |
| TW | 582005 | 4/2004 |
| TW | 200416514 | 9/2004 |
| TW | 200746169 | 12/2007 |
| TW | 200826054 | 6/2008 |
| TW | 200836150 | 9/2008 |
| TW | 200951968 | 12/2009 |
| WO | WO-2005/088726 | 9/2005 |
| WO | 2009/034749 | 3/2009 |
| WO | WO-2009/028353 | 3/2009 |
| WO | WO-2009/028716 | 3/2009 |
| WO | WO-2009/034749 | 3/2009 |
| WO | WO-2009/034750 | 3/2009 |
| WO | WO-2009/084267 | 7/2009 |
| WO | WO-2009/110623 | 9/2009 |
| WO | WO-2009/133749 | 11/2009 |
| WO | WO-2011/111531 | 9/2011 |
| WO | WO-2011/145666 | 11/2011 |
| WO | WO-2012/002197 | 1/2012 |

OTHER PUBLICATIONS

Written Opinion (Application No. PCT/JP2011/061465) dated Jul. 5, 2011.
Taiwanese Office Action (Application No. 100117581) dated Mar. 1, 2016.
Taiwanese Office Action (Application No. 105117622) dated Feb. 22, 2017.

* cited by examiner

PULSE OUTPUT CIRCUIT, SHIFT REGISTER, AND DISPLAY DEVICE

CROSS-REFERENCE TO RELATED APPLICATIONS

This application is a continuation of U.S. application Ser. No. 15/393,389, filed Dec. 29, 2016, now allowed, which is a continuation of U.S. application Ser. No. 14/831,939, filed Aug. 21, 2015, now U.S. Pat. No. 9,543,039, which is a continuation of U.S. application Ser. No. 13/111,064, filed May 19, 2011, now U.S. Pat. No. 9,117,537, which claims the benefit of a foreign priority application filed in Japan as Serial No. 2010-117615 on May 21, 2010, all of which are incorporated by reference.

TECHNICAL FIELD

The present invention relates to a driver circuit (also referred to as a pulse output circuit or a shift register). The present invention also relates to a display device including a driver circuit formed over the same substrate as a pixel portion, and/or an electronic device having the display device.

BACKGROUND ART

With the widespread of large display devices such as liquid crystal televisions, products with higher-value-added have been demanded and thus under development. In particular, a technique to configure a driver circuit such as a scan line driver circuit over the same substrate as a pixel portion, using thin film transistors (TFTs) whose channel regions are made of an amorphous semiconductor has been actively developed because the technique greatly contributes to reduction in cost and improvement in reliability.

Further, reduction in power consumption of the display device is a large object. Patent Document 1 discloses an image display device having a partial display function, which is equipped with an output control block which controls an output of an ON signal to a scan signal line such that display scan signals are output in a batch to a plurality of scan signal lines for a non-display region, in response to a control signal for switching the output of an ON signal to a scan signal line from sequential output to batch output.

REFERENCE

Patent Document 1: Japanese Published Patent Application No. 2001-343928

DISCLOSURE OF INVENTION

In a display device, a gate line (scan line) is provided for each pixel line of a display panel in which a plurality of pixels is arranged in a matrix manner, and the display device is driven with the gate lines (scan lines) sequentially selected with a period of one horizontal period of a display scan signal, whereby a display image is renewed. As a gate line driver circuit (scan line driver circuit) for performing sequential selection among the pixel lines, i.e., the gate lines (scan lines) in this manner, a shift register for performing a round of shift operation in one frame period of the display scan signal can be used. With such a shift register in the driver circuit, a count-up operation has been performed per unit period to control an output signal. However, there has been a problem in that the number of output signals of the scan signal lines for all of the scan lines (signal lines) leads to a long data writing period.

One object of one embodiment of the present invention is to provide a driver circuit and/or a display device which reduce(s) a flicker on a screen of the display device, and ensure(s) a decrease of a data writing period and a reduction in power consumption.

One embodiment of the present invention is a pulse output circuit which includes a 1st transistor whose 1st electrode is electrically connected to a 1st input terminal, whose 2nd electrode is electrically connected to a 1st output terminal, and whose gate electrode is electrically connected to a 1st node; a 2nd transistor whose 1st electrode is electrically connected to the 1st output terminal, whose 2nd electrode is electrically connected to a 1st power source line, and whose gate electrode is electrically connected to a 2nd node; a 3rd transistor whose 1st electrode is electrically connected to the 1st input terminal, whose 2nd electrode is electrically connected to a 2nd output terminal, and whose gate electrode is electrically connected to the 1st node; a 4th transistor whose 1st electrode is electrically connected to the 2nd output terminal, whose 2nd electrode is electrically connected to a 2nd power source line, and whose gate electrode is electrically connected to the 2nd node; and a control portion which controls the levels of potentials supplied to the 1st and 2nd nodes. A high-potential drive voltage and a low-potential drive voltage are switched to be supplied to the 2nd power source line.

One embodiment of the present invention is a pulse output circuit which includes 1st to 11th transistors, 1st to 5th input terminals, a 1st output terminal, and a 2nd output terminal and is electrically connected to 1st to 6th power source lines. A 1st electrode of the 1st transistor is electrically connected to the 1st input terminal, a 2nd electrode thereof is electrically connected to a 1st electrode of the 2nd transistor, and a gate electrode thereof is electrically connected to a gate electrode of the 3rd transistor and a 1st electrode of the 7th transistor. A 2nd electrode of the 2nd transistor is electrically connected to the 1st power source line, and a gate electrode thereof is electrically connected to a gate electrode of the 4th transistor, a gate electrode of the 6th transistor, a 2nd electrode of the 9th transistor, a 2nd electrode of the 10th transistor, and a 1st electrode of the 11th transistor. A 1st electrode of the 3rd transistor is electrically connected to the 1st input terminal, and a 2nd electrode thereof is electrically connected to the 2nd output terminal. A 1st electrode of the 4th transistor is electrically connected to the 2nd output terminal, and a 2nd electrode thereof is electrically connected to the 2nd power source line. A 1st electrode of the 5th transistor is electrically connected to a 2nd electrode of the 7th transistor, a 2nd electrode thereof is electrically connected to the 3rd power source line, and a gate electrode thereof is electrically connected to the 4th input terminal. A 1st electrode of the 6th transistor is electrically connected to a 1st electrode of the 5th transistor, and a 2nd electrode thereof is electrically connected to the 1st power source line. A gate electrode of the 7th transistor is electrically connected to the 4th power source line. A 1st electrode of the 8th transistor is electrically connected to the 5th power source line, a 2nd electrode thereof is electrically connected to a 1st electrode of the 9th transistor, and a gate electrode thereof is electrically connected to the 2nd input terminal. A gate electrode of the 9th transistor is electrically connected to the 3rd input terminal. A 1st electrode of the 10th transistor is electrically connected to the 6th power source line, and a gate electrode thereof is electrically connected to the 5th input terminal. A 2nd electrode of the 11th transistor is electrically connected to the 1st power source line, and a gate electrode thereof is electrically connected to the 4th input terminal. A high-potential drive voltage and a low-potential drive voltage are switched to be supplied to the 2nd power source line.

In one embodiment of the present invention, the potentials of the 3rd power source line, the 4th power source line, the 5th power source line, and the 6th power source line in the pulse output circuit each may be higher than any of the potentials of the 1st power source line and the 2nd power source line.

In one embodiment of the present invention, the 1st to 11th transistors in the pulse output circuit may be n-channel transistors.

One embodiment of the present invention is a shift register which includes at least a (m−1)-th pulse output circuit, a m-th pulse output circuit, a (m+1)-th pulse output circuit, and a (m+2)-th pulse output circuit, where m≥2, and has 1st to 4th signal lines for outputting clock signals. 1st to 3rd input terminals of the m-th pulse output circuit are electrically connected to three signal lines among the 1st to 4th signal lines, a 4th input terminal thereof is electrically connected to a 1st output terminal of the (m−1)-th pulse output circuit, a 5th input terminal thereof is electrically connected to a 1st output terminal of the (m+2)-th pulse output circuit, and a 1st output terminal thereof is electrically connected to a 4th input terminal of the (m+1)-th pulse output circuit.

In one embodiment of the present invention, the 1st to 4th signal lines in the shift register may output clock signals which are sequentially delayed by ¼ period.

According to one embodiment of the present invention, a driver circuit and/or a display device which reduce(s) a flicker on a screen of the display device, and ensure(s) a decrease of a data writing period and a reduction in power consumption can be provided.

BEST MODE FOR CARRYING OUT THE INVENTION

Figure 1A:
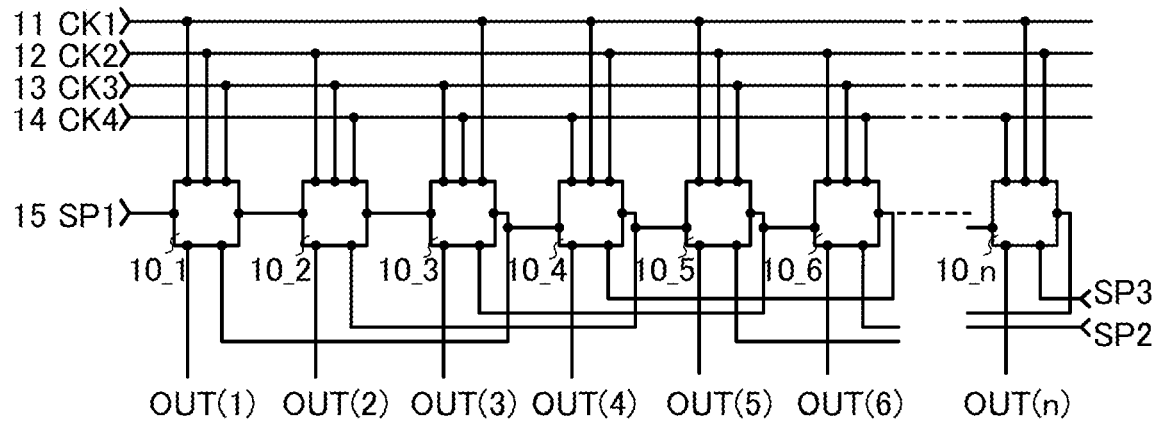
FIG. 1A is a diagram showing an example of a shift register.

Hereinafter, embodiments of the present invention will be described with reference to the accompanying drawings. However, the present invention can be carried out in many different modes, and it is easily understood by those skilled in the art that modes and details of the present invention can be modified in various ways without departing from the purpose and the scope of the present invention. Therefore, the present invention is not interpreted as being limited to the description of the embodiments below. Note that identical portions in the structures of the present invention that are described below are denoted by the same reference numerals throughout the drawings.

Further, in the drawings for the description below, in the case where transistors are indicated by solid lines and dotted lines, a transistor indicated by a solid line means the transistor being conducting (ON), whereas a transistor indicated by a dotted line means the transistor being non-conducting (OFF).

Embodiment 1

In Embodiment 1, an example of a pulse output circuit and an example of a shift register including the pulse output circuit will be described with reference to FIGS. 1A to 1C.

A shift register described in this embodiment includes 1st to n-th pulse output circuits $10_{-1}$ to $10_{-n}$ (n≥2) and 1st to 4th signal lines 11 to 14 for outputting clock signals (see FIG. 1A). The 1st signal line 11 outputs a 1st clock signal CK1, the 2nd signal line 12 outputs a 2nd clock signal CK2, the 3rd signal line 13 outputs a 3rd clock signal CK3, and the 4th signal line 14 outputs a 4th clock signal CK4.

The clock signals CK are signals which alternate between an H-level signal and an L-level signal at regular intervals; in this embodiment, the 1st to 4th clock signals CK1 to CK4 are delayed by ¼ period sequentially. In this embodiment, with the 1st to 4th clock signals CK1 to CK4, control or the like of driving of a pulse output circuit is performed.

Figure 1B:
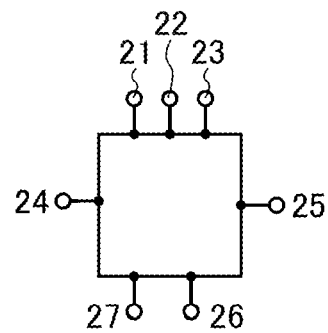
FIGS. 1B and 1C are diagrams showing an example of a pulse output circuit.

Each of the 1st to n-th pulse output circuits $10_{-1}$ to $10_{-n}$ includes a 1st input terminal 21, a 2nd input terminal 22, a 3rd input terminal 23, a 4th input terminal 24, a 1st output terminal 25, a 5th input terminal 26, and a 2nd output terminal 27 (see FIG. 1B).

The 1st input terminal 21, the 2nd input terminal 22, and the 3rd input terminal 23 are electrically connected to three of the 1st to 4th signal lines 11 to 14. For example, in FIGS. 1A to 1C, the 1st input terminal 21 of the 1st pulse output circuit $10_{-1}$ is electrically connected to the 1st signal line 11, the 2nd input terminal 22 thereof is electrically connected to the 2nd signal line 12, and the 3rd input terminal 23 thereof is electrically connected to the 3rd signal line 13. The 1st input terminal 21 of the 2nd pulse output circuit 10_2 is electrically connected to the 2nd signal line 12, the 2nd input terminal 22 thereof is electrically connected to the 3rd signal line 13, and the 3rd input terminal 23 thereof is electrically connected to the 4th signal line 14.

Further, as for a m-th pulse output circuit (□m□≥2) of the shift register described in this embodiment, the 4th input terminal 24 of the m-th pulse output circuit is electrically connected to the 1st output terminal 25 of a (m−1)-th pulse output circuit, the 5th input terminal 26 of the m-th pulse output circuit is electrically connected to the 1st output terminal 25 of a (m+2)-th pulse output circuit, the 1st output terminal 25 of the m-th pulse output circuit is electrically connected to the 4th input terminal 24 of a (m+1)-th pulse output circuit, and the 2nd output terminal 27 of the m-th pulse output circuit outputs a signal to OUT(m).

For example, as for a 3rd pulse output circuit 10_3, the 4th input terminal 24 of the 3rd pulse output circuit 10_3 is electrically connected to the 1st output terminal 25 of a 2nd pulse output circuit 10_2, the 5th input terminal 26 of the 3rd pulse output circuit 10_3 is electrically connected to the 1st output terminal 25 of a 5th pulse output circuit 10_5, and the 1st output terminal 25 of the 3rd pulse output circuit 10_3 is electrically connected to the 4th input terminal 24 of a 4th pulse output circuit 10_4 and the 5th input terminal 26 of the 1st pulse output circuit 10_1.

Further, a 1st start pulse (SP1) is input to the 4th input terminal 24 of the 1st pulse output circuit 10_1. A 2nd start pulse (SP2) is input to the 5th input terminal 26 of a (n−1)-th pulse output circuit 10_(n−1). A 3rd start pulse (SP3) is input to the 5th input terminal 26 of the n-th pulse output circuit 10_n. The 2nd start pulse (SP2) and the 3rd start pulse (SP3) may be input from the outside or generated inside a driver circuit.

Next, a specific structure of each of the 1st to n-th pulse output circuits 10_1 to 10_n will be described.

Figure 1C:
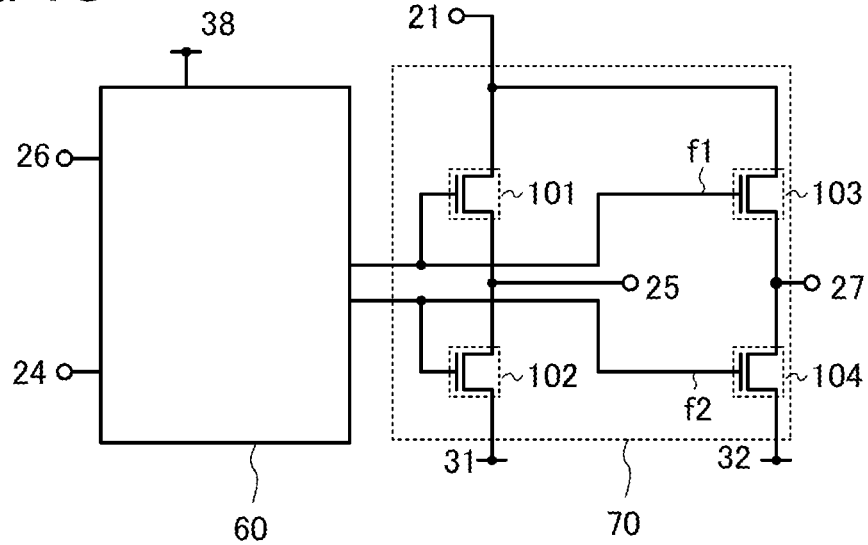

FIG. 1C is a schematic view of a pulse output circuit of one embodiment of the present invention. Each of the 1st to n-th pulse output circuits 10_1 to 10_n includes an output portion 70 including a 1st transistor 101 and a 3rd transistor 103 for outputting the 1st clock signal CK1 to the output line with a node f1 controlled, a 2nd transistor 102 for outputting a low-potential drive voltage VSS1 to the output line with a node f2 controlled, and a 4th transistor 104 for outputting a variable-potential drive voltage VSS2 to the output line with the node f2 controlled, and a control portion 60 which controls the node f1 and the node f2. Further, signals are supplied to the 1st to 4th transistors 101 to 104 from a 1st power source line 31, a 2nd power source line 32, and a 8th power source line 38, in addition to the 1st input terminal 21, the 4th input terminal 24, the 5th input terminal 26, the 1st output terminal 25, and the 2nd output terminal 27.

A 1st electrode of the 1st transistor 101 is electrically connected to the 1st input terminal 21, a 2nd electrode thereof is electrically connected to a 1st electrode of the 2nd transistor 102, and a gate electrode thereof is electrically connected to the node f1. The 1st electrode of the 2nd transistor 102 is electrically connected to the 1st output terminal 25, a 2nd electrode thereof is electrically connected to the 1st power source line 31, and a gate electrode thereof is electrically connected to the node f2. A 1st electrode of the 3rd transistor 103 is electrically connected to the 1st input terminal 21, a 2nd electrode thereof is electrically connected to a 1st electrode of the 4th transistor 104, and a gate electrode thereof is electrically connected to the node f1. The 1st electrode of the 4th transistor 104 is electrically connected to the 2nd output terminal 27, a 2nd electrode thereof is electrically connected to the 2nd power source line 32, and a gate electrode thereof is electrically connected to the node f2.

Figure 2:
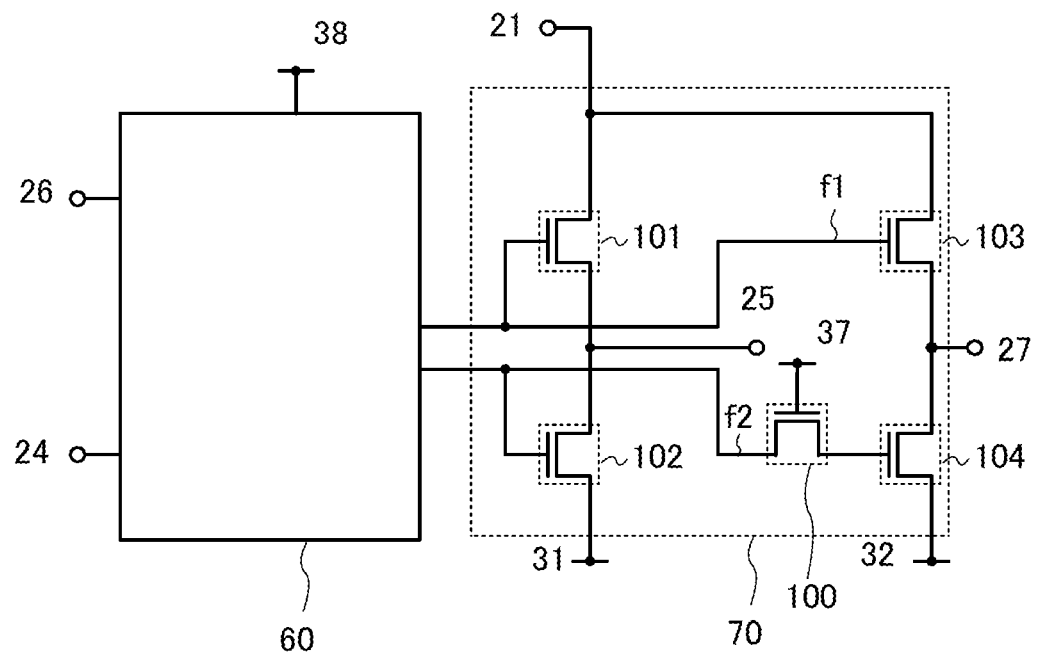
FIG. 2 is a diagram showing an example of a shift register and a pulse output circuit.

As shown in FIG. 2, in the node f2, in order to reduce the voltage stress applied to the 2nd transistor 102, a transistor 100 may be provided between the gate electrodes of the 2nd transistor 102 and the 4th transistor 104. In that case, a gate electrode of the transistor 100 is electrically connected to a 7th power source line 37.

Figure 6A:
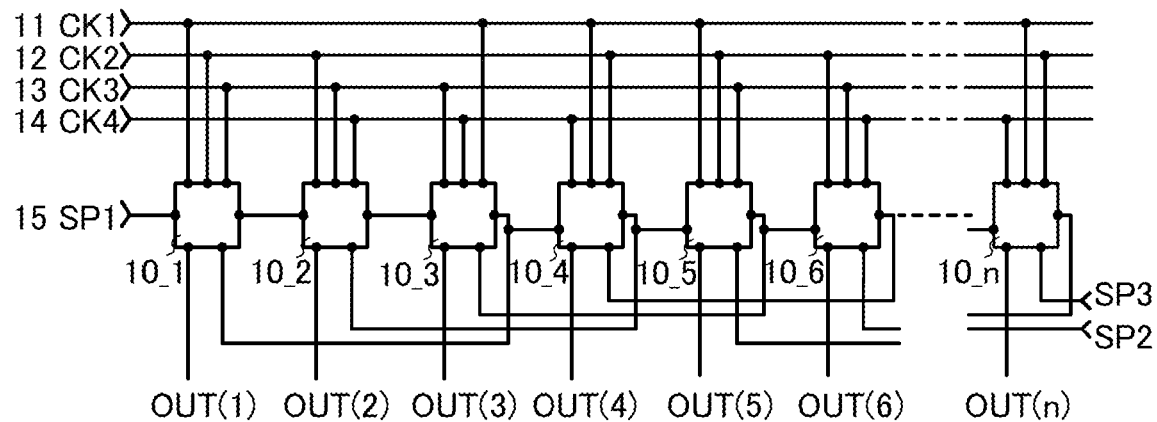
FIG. 6A is a diagram showing an example of a shift register.
Figure 6B:
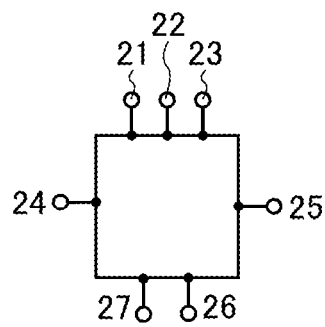
FIGS. 6B and 6C are diagrams showing an example of a pulse output circuit.
Figure 6C:
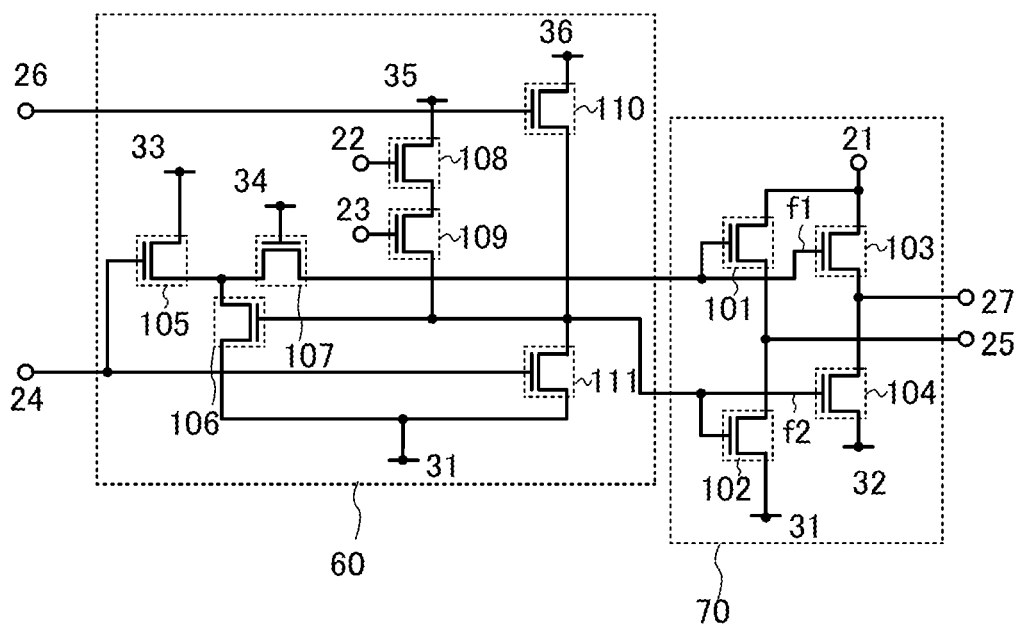

The control portion 60 includes 5th to 11th transistors 105 to 111 in FIG. 6C; however, any other configuration can be employed as long as the control portion 60 can control the nodes f1 and f2. In this embodiment, description is made on operation of the pulse output circuit with reference to the timing chart shown in FIG. 4, in the case of employing the configuration of the control portion 60 shown in FIG. 6C. Specifically, description is made with the timing chart of FIG. 4 by dividing one period into a 1st period 51, a 2nd period 52, a 3rd period 53, a 4th period 54, and a 5th period 55. Start time of the 1st period 51, a start time of the 2nd period 52, a start time of the 3rd period 53, a start time of the 4th period 54, and a start time of the 5th period 55 are denoted by a, b, c, d, and e, respectively. A period t1 from a time 61 to a time 62 including the 1st period 51, the 2nd period 52, the 3rd period 53, and the 4th period 54 is a normal mode, and a period t2 from the time 62 to a time 63, which is the 5th period 55, is a batch mode. Further, the period t2 is followed by the normal mode again in this embodiment. Note that in the following description, the 1st to 4th transistors 101 to 104 are n-channel transistors, so that they are each turned on when voltage (Vgs) between the gate electrode and the source electrode exceeds the threshold voltage (Vth).

An output of the 1st pulse output circuit 10_1 shown in FIG. 1A is described. The 1st input terminal 21 of the 1st pulse output circuit 10_1 is electrically connected to the 1st signal line 11 for supplying the 1st clock signal CK1, the 2nd input terminal 22 thereof is electrically connected to the 2nd signal line 12 for supplying the 2nd clock signal CK2, and the 3rd input terminal 23 thereof is electrically connected to the 3rd signal line 13 for supplying the 3rd clock signal CK3.

The low-potential drive voltage VSS1, the variable-potential drive voltage VSS2, and a high-potential drive voltage VDD are supplied to the 1st power source line 31, the 2nd power source line 32, and the 8th power source line 38, respectively. In this embodiment, VSS1 is lower than VDD, and VSS2 is lower than or equal to VDD. Further, the 1st to 4th clock signals CK1 to CK4 each alternate between an H level and an L level at regular intervals; the potential at the H level is VDD and the potential at the L level is VSS1. In addition, VSS1 is 0 for simplification of explanation in this embodiment; however, the present invention is not limited thereto.

In the 1st period 51, the 1st start pulse SP1 is set to the H level (at a in FIG. 4) to charge the node f1 to increase the potential thereof, and the node f2 is discharged to VSS1. Therefore, the 1st transistor 101 and the 3rd transistor 103 are turned on, and the 2nd transistor 102 and the 4th transistor 104 are turned off. Consequently, each of the potentials of the 1st output terminal 25 and the 2nd output terminal 27 in the 1st period 51 is at the L level of the 1st clock signal CK1 (see FIG. 5A).

In the 2nd period 52, the 1st clock signal CK1 is changed to the H level (at b in FIG. 4) to make the node f1 into the floating state, so that the node f1 is bootstrapped by capacitive coupling of parasitic capacitance formed in a portion where the gate electrode of the 3rd transistor 103 overlaps with the source electrode thereof. Accordingly, the potential of the node f1 is further increased, which turns the 1st transistor 101 and the 3rd transistor 103 completely on. Consequently, each of the potentials of the 1st output terminal 25 and the 2nd output terminal 27 in the 2nd period 52 is at the H level (see FIG. 5B).

During the above period, the potential of the node f2 is kept at the L level, so that defects due to capacitive coupling of the node f2 and the 1st output terminal 25 and capacitive coupling of the node f2 and the 2nd output terminal 27 can be suppressed when each of the potentials of the 1st output terminal 25 and the 2nd output terminal 27 rises from the L level to the H level.

In the 3rd period 53, the 1st start pulse SP1 is changed from the H level to the L level (at c in FIG. 4), the 1st clock signal CK1 is kept at the H level as in the 2nd period 52, and the potential of the node f1 is not changed since the 2nd period 52, so that the 1st transistor 101 and the 3rd transistor 103 are kept ON. Consequently, each of the potentials of the 1st output terminal 25 and the 2nd output terminal 27 in the 3rd period 53 is at the H level (see FIG. 5C).

In the 4th period 54, the 1st clock signal CK1 is changed from the H level to the L level (at d in FIG. 4), and a reset signal RESET is input, so that the potential of the node f1 is discharged to VSS1 and the potential of the node f2 is increased. Accordingly, the 1st transistor 101 and the 3rd transistor 103 are turned off, and the 2nd transistor 102 and the 4th transistor 104 are tuned on. Consequently, each of the potentials of the 1st output terminal 25 and the 2nd output terminal 27 in the 4th period 54 is at the L level (see FIG. 5D).

Figure 4:
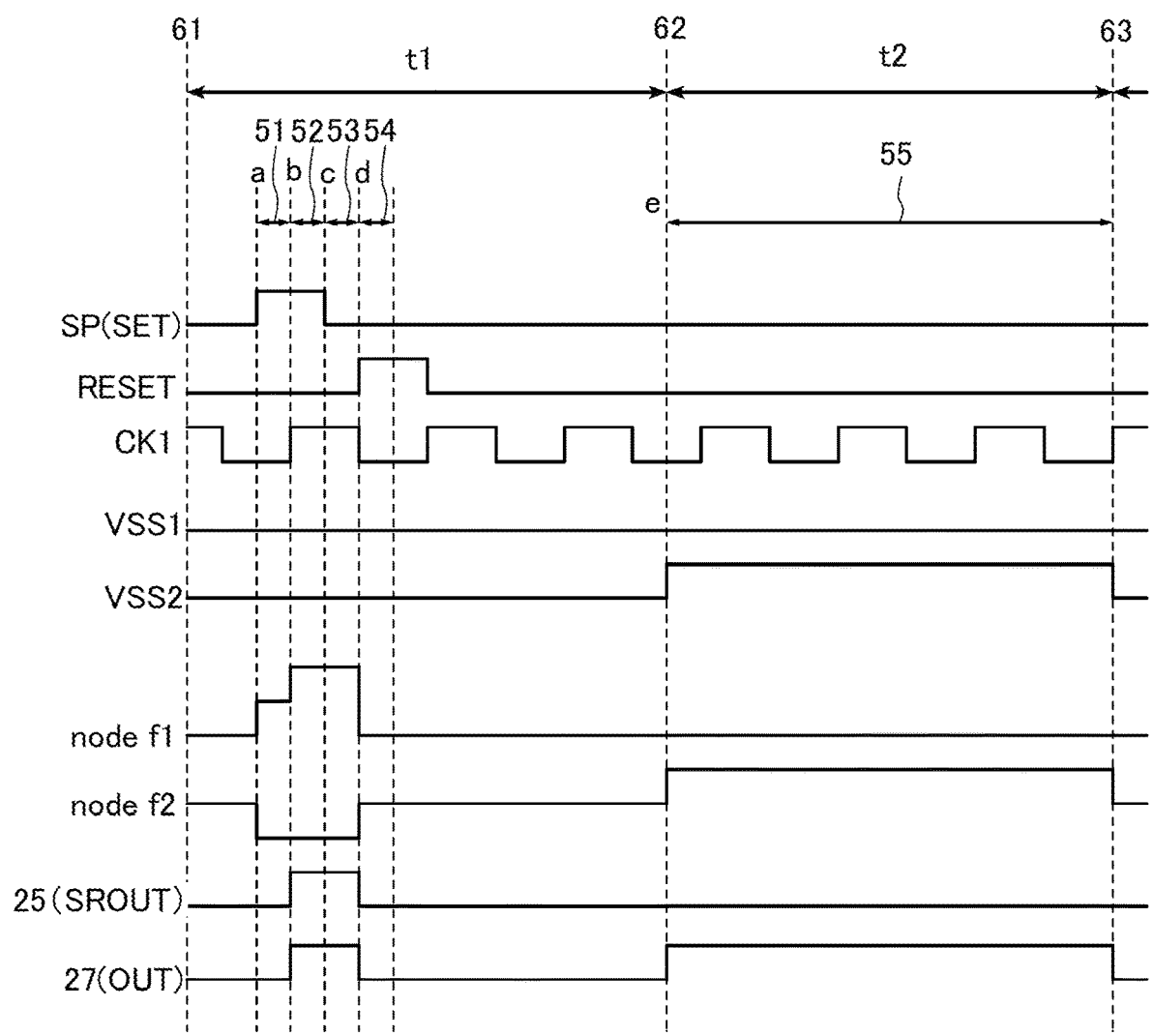
FIG. 4 is a chart showing an operation example of a pulse output circuit.
Figure 5A:
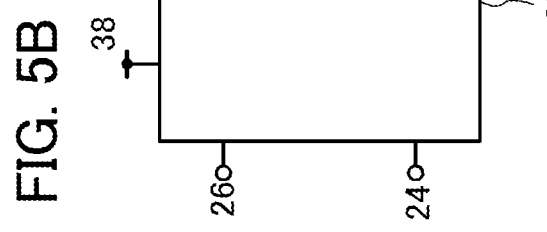
FIGS. 5A to 5D are comparison diagrams showing operation of a pulse output circuit.
Figure 5B:
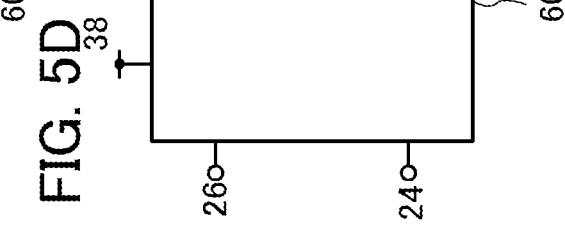
Figure 5C:
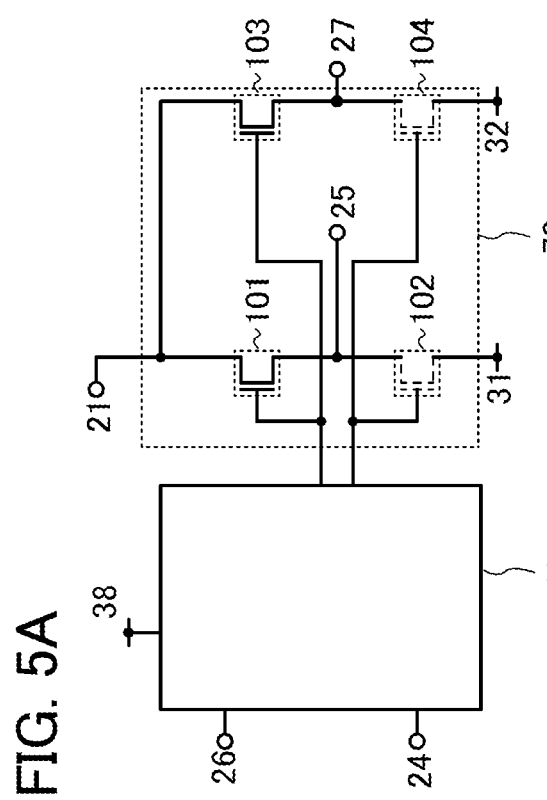
Figure 5D:
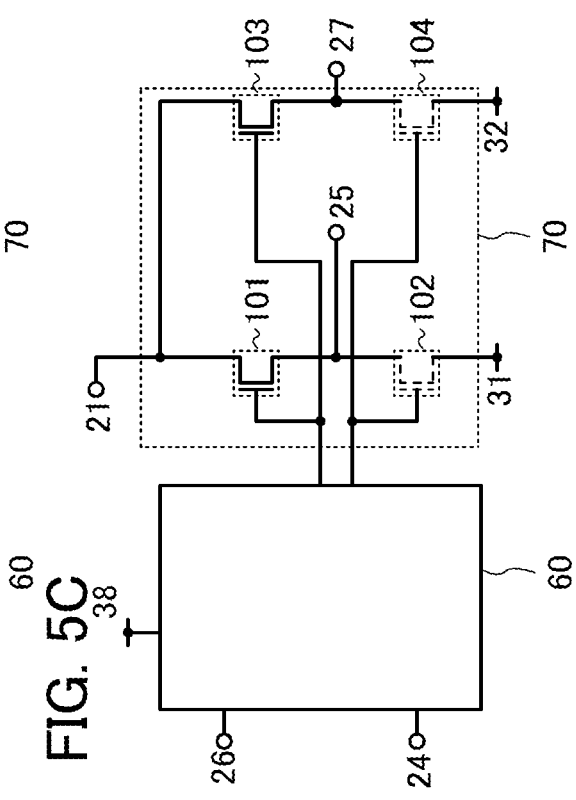

Next, the normal mode is switched to a batch-ON mode, for which the potential of the 2nd power source line 32 (VSS2) is changed from the L level to the H level in the 5th period 55 (at e in FIG. 4). The 1st start pulse SP1 and the reset signal RESET are kept at the L level. In that time, with the H level potential supplied to the 2nd power source line 32, the node f2 being in the floating state is bootstrapped by capacitive coupling of parasitic capacitance formed in a portion where the gate electrode of the 4th transistor 104 overlaps with the source electrode thereof. Accordingly, the potential of the node f2 is increased, which can turn the 4th transistor 104 completely on. Further, the potential of the 1st power source line 31 is kept at the L level. Consequently, in the 5th period 55, the potential of the 1st output terminal 25 is at the L level, and that of the 2nd output terminal 27 is at the H level.

As shown in FIG. 2, in order to reduce the voltage stress applied to the 2nd transistor 102 in the case where the potential of the 2nd power source line 32 is at the H level in the 5th period 55, the transistor 100 may be provided for the node f2.

In this manner, with the configuration in which the 1st power source line 31 is electrically connected to the 2nd electrode of the 2nd transistor 102 and the 2nd power source line 32 is electrically connected to the 2nd electrode of the 4th transistor 104, the potential of the 2nd electrode of the 2nd transistor 102 and that of the 2nd electrode of the 4th transistor 104 can be controlled individually without depending on each other in a period during which the potentials of the 4th input terminal 24 and the 5th input terminal 26 are kept at the L level. In that case, in the output portion 70 of the pulse output circuit in the shift register, the potential supplied from the 1st power source line 31 to the 2nd transistor 102 which is electrically connected to the 1st output terminal 25 which is connected to the pulse output circuit at the next stage is set to the low-potential drive voltage VSS1, and the potential supplied from the 2nd power source line 32 to the 4th transistor 104 which is electrically connected to the 2nd output terminal 27 which is connected to a scan signal line is set to the variable potential drive voltage VSS2.

The variable potential drive voltage VSS2 is set to the low-potential drive voltage VSS1 in the normal mode, and is set to the high-potential drive voltage VDD in the batch-ON mode and to the low-potential drive voltage VSS1 in a batch-OFF mode in the batch mode, whereby the potential of the 2nd output terminal 27 can be controlled as appropriate by changing the potential of the 2nd power source line 32. Accordingly, ON signals (or OFF signals) can be output to the 2nd output terminals 27 connected to respective scan signal lines at the same timing in a batch.

According to the above structure and method, display scan signals (ON signals or OFF signals) can be output to a plurality of scan signal lines at the same timing in a batch in the case of display with single color (e.g., all black or all white), in a driver circuit of an image display device, so that the data writing period can be decreased. Further, a period during which a scan signal line driver portion stops operating can be provided after a batch display, so that power consumption of the scan signal line driver portion can be reduced by the period. Further, high-speed operation can be realized, which enables a load on a driver circuit portion to be reduced, so that a flicker on the screen can be prevented.

FIGS. 6A to 6C illustrate a specific circuit structure of the pulse output circuit shown in FIG. 1C.

A shift register of one embodiment of the present invention includes the 1st to n-th pulse output circuits $10_{-1}$ to $10_{-n}$ (n≥2) and the 1st to 4th signal lines 11 to 14 for outputting clock signals (see FIG. 6A). The 1st signal line 11 outputs the 1st clock signal CK1, the 2nd signal line 12 outputs the 2nd clock signal CK2, the 3rd signal line 13 outputs the 3rd clock signal CK3, and the 4th signal line 14 outputs the 4th clock signal CK4.

The clock signals CK are signals which alternate between an H-level signal and an L-level signal at regular intervals; in this embodiment, the 1st to 4th clock signals CK1 to CK4 are delayed by ¼ period sequentially. In this embodiment, with the 1st to 4th clock signals CK1 to CK4, control or the like of driving of the pulse output circuit is performed.

Each of the 1st to n-th pulse output circuits $10_{-1}$ to $10_{-n}$ includes the 1st input terminal 21, the 2nd input terminal 22, the 3rd input terminal 23, the 4th input terminal 24, the 1st output terminal 25, the 5th input terminal 26, and the 2nd output terminal 27 (see FIG. 6B).

The 1st input terminal 21, the 2nd input terminal 22, and the 3rd input terminal 23 are electrically connected to three of the 1st to 4th signal lines 11 to 14. For example, in FIGS. 6A to 6C, the 1st input terminal 21 of the 1st pulse output circuit $10_{-1}$ is electrically connected to the 1st signal line 11, the 2nd input terminal 22 thereof is electrically connected to the 2nd signal line 12, and the 3rd input terminal 23 thereof is electrically connected to the 3rd signal line 13. The 1st input terminal 21 of the 2nd pulse output circuit $10_{-2}$ is electrically connected to the 2nd signal line 12, the 2nd input terminal 22 thereof is electrically connected to the 3rd signal line 13, and the 3rd input terminal 23 thereof is electrically connected to the 4th signal line 14.

Further, as for the m-th pulse output circuit (□m□≥2) of the shift register described in this embodiment, the 4th input terminal 24 of the m-th pulse output circuit is electrically connected to the 1st output terminal 25 of the (m−1)-th pulse output circuit, the 5th input terminal 26 of the m-th pulse output circuit is electrically connected to the 1st output terminal 25 of the (m+2)-th pulse output circuit, the 1st output terminal 25 of the m-th pulse output circuit is electrically connected to the 4th input terminal 24 of the (m+1)-th pulse output circuit, and the 2nd output terminal 27 of the m-th pulse output circuit outputs a signal to OUT(m).

For example, as for the 3rd pulse output circuit $10_{\_3}$, the 4th input terminal 24 of the 3rd pulse output circuit $10_{\_3}$ is electrically connected to the 1st output terminal 25 of the 2nd pulse output circuit $10_{\_2}$, the 5th input terminal 26 of the 3rd pulse output circuit $10_{\_3}$ is electrically connected to the 1st output terminal 25 of the 5th pulse output circuit $10_{\_5}$, and the 1st output terminal 25 of the 3rd pulse output circuit $10_{\_3}$ is electrically connected to the 4th input terminal 24 of the 4th pulse output circuit $10_{\_4}$ and the 5th input terminal 26 of the 1st pulse output circuit $10_{\_1}$.

Further, the 1st start pulse SP1 is input to the 4th input terminal 24 of the 1st pulse output circuit $10_{\_1}$. The 2nd start pulse SP2 is input to the 5th input terminal 26 of the (n−1)-th pulse output circuit $10_{\_(n-1)}$. The 3rd start pulse SP3 is input to the 5th input terminal 26 of the n-th pulse output circuit $10_{\_n}$. The 2nd start pulse SP2 and the 3rd start pulse SP3 may be input from the outside or generated inside a driver circuit.

Next, a specific structure of each of the 1st to n-th pulse output circuits $10_{\_1}$ to $10_{\_n}$ will be described further in detail.

The 1st to n-th pulse output circuits $10_{\_1}$ to $10_{\_n}$ each include the 1st to 4th transistors 101 to 104 and 5th to 11th transistors 105 to 111 (see FIG. 6C). Further, signals are supplied to the 1st to 11th transistors 101 to 111 from the 1st and 2nd power source lines 31 and 32, and 3rd to 6th power source lines 33 to 36, in addition to the 1st input terminal 21, the 2nd input terminal 22, the 3rd input terminal 23, the 4th input terminal 24, the 5th input terminal 26, the 1st output terminal 25, and the 2nd output terminal 27.

The 1st electrode of the 1st transistor 101 is electrically connected to the 1st input terminal 21, the 2nd electrode thereof is electrically connected to the 1st electrode of the 2nd transistor 102, and the gate electrode thereof is electrically connected to the gate electrode of the 3rd transistor 103 and a 1st electrode of the 7th transistor 107. The 2nd electrode of the 2nd transistor 102 is electrically connected to the 1st power source line 31, and the gate electrode thereof is electrically connected to the gate electrode of the 4th transistor 104, a gate electrode of the 6th transistor 106, a 2nd electrode of the 9th transistor 109, a 2nd electrode of the 10th transistor 110, and a 1st electrode of the 11th transistor 111. The 1st electrode of the 3rd transistor 103 is electrically connected to the 1st input terminal 21, and the 2nd electrode thereof is electrically connected to the 2nd output terminal 27. The 1st electrode of the 4th transistor 104 is electrically connected to the 2nd output terminal 27, and the 2nd electrode thereof is electrically connected to the 2nd power source line 32. A 1st electrode of the 5th transistor 105 is electrically connected to the 3rd power source line 33, a 2nd electrode thereof is electrically connected to a 2nd electrode of the 7th transistor 107, and a gate electrode thereof is electrically connected to the 4th input terminal 24. A 1st electrode of the 6th transistor 106 is electrically connected to the 2nd electrode of the 5th transistor 105, and a 2nd electrode thereof is electrically connected to the 1st power source line 31. A gate electrode of the 7th transistor 107 is electrically connected to the 4th power source line 34. A 1st electrode of the 8th transistor 108 is electrically connected to the 5th power source line 35, a 2nd electrode thereof is electrically connected to a 1st electrode of the 9th transistor 109, and a gate electrode thereof is electrically connected to the 2nd input terminal 22. A gate electrode of the 9th transistor 109 is electrically connected to the 3rd input terminal 23. A 1st electrode of the 10th transistor 110 is electrically connected to the 6th power source line 36, and a gate electrode thereof is electrically connected to the 5th input terminal 26. A 2nd electrode of the 11th transistor 111 is electrically connected to the 1st power source line 31, and a gate electrode thereof is electrically connected to the 4th input terminal 24.

In FIG. 6C, a portion where the gate electrode of the 1st transistor 101, the gate electrode of the 3rd transistor 103, and the 1st electrode of the 7th transistor 107 are connected to one another is denoted by the node f1. A portion where the gate electrode of the 2nd transistor 102, the gate electrode of the 4th transistor 104, the gate electrode of the 6th transistor 106, the 2nd electrode of the 9th transistor 109, the 2nd electrode of the 10th transistor 110, and the 1st electrode of the 11th transistor 111 are connected to one another is denoted by the node f2.

Figure 3:
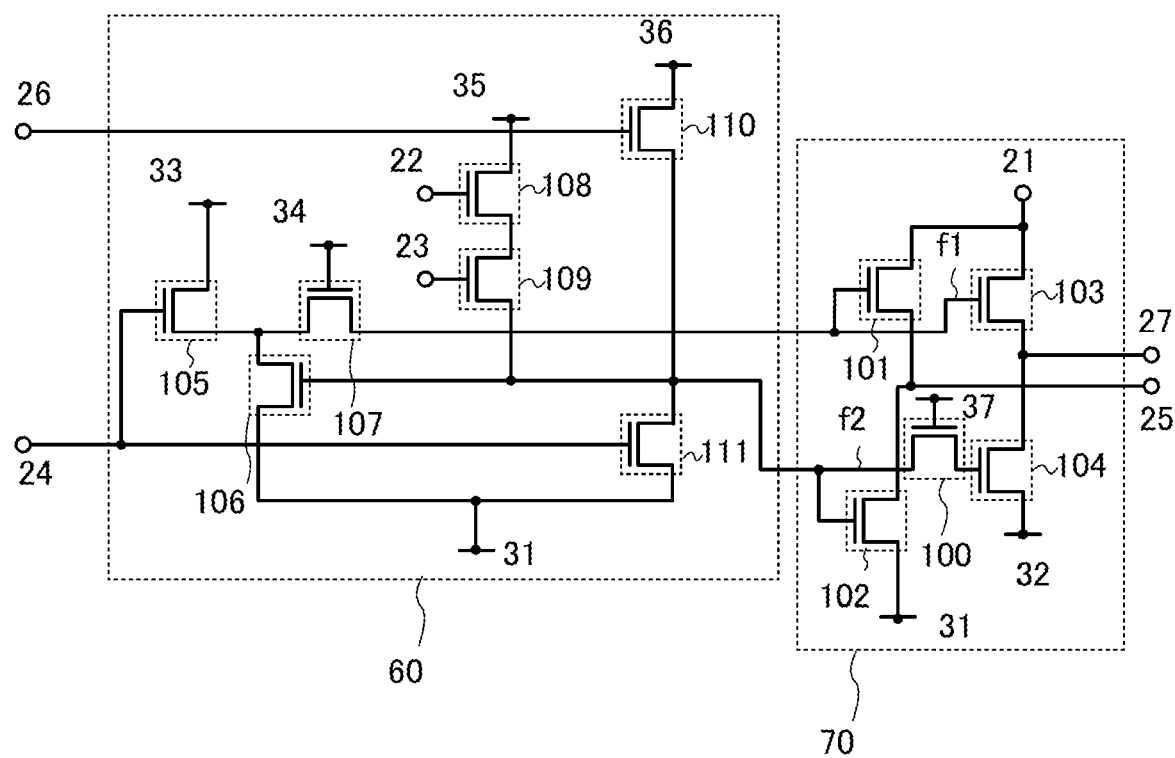
FIG. 3 is a diagram showing an example of a shift register and a pulse output circuit.

As shown in FIG. 3, in the node f2, in order to reduce the voltage stress applied to the 2nd transistor 102, the 6th transistor 106, and the 11th transistor 111, the transistor 100 may be provided between the gate electrodes of the 2nd transistor 102 and the 4th transistor 104. In that case, the gate electrode of the transistor 100 is electrically connected to the 7th power source line 37.

The connection relation where the clock signal is supplied through the 2nd input terminal 22 to the gate electrode of the 8th transistor 108 and the clock signal is supplied through the 3rd input terminal 23 to the gate electrode of the 9th transistor 109 may be changed to a connection relation where the clock signal is supplied through the 3rd input terminal 23 to the gate electrode of the 8th transistor 108 and the clock signal is supplied through the 2nd input terminal 22 to the gate electrode of the 9th transistor 109. Accordingly, a decrease in the potential of the node f2 due to the decrease of the potentials of the 2nd input terminal 22 and the 3rd input terminal 23 can be reduced, so that a change of the potential of the node f2 can be suppressed and noise can be decreased.

Next, operation of the shift register shown in FIGS. 1A to 1C is described with reference to FIG. 7, FIGS. 8A and 8B, and FIGS. 9A and 9B. Specifically, description is made with the timing chart of FIG. 7 by dividing one period into the 1st period 51, the 2nd period 52, the 3rd period 53, the 4th period 54, and the 5th period 55. The start time of the 1st period 51, the start time of the 2nd period 52, the start time of the 3rd period 53, the start time of the 4th period 54, and the start time of the 5th period 55 are denoted by a, b, c, d, and e, respectively. The period t1 from the time 61 to the time 62 including the 1st period 51, the 2nd period 52, the 3rd period 53, and the 4th period 54 is the normal mode, and the period t2 from the time 62 to the time 63, which is the 5th period 55, is the batch mode. Further, the period t2 is followed by the normal mode again in this embodiment. Note that in the following description, the 1st to 4th transistors 101 to 104 are n-channel transistors, so that they are each turned on when the voltage (Vgs) between the gate electrode and the source electrode exceeds the threshold voltage (Vth).

Further, the output of the 1st pulse output circuit $10_{\_1}$ is described. The 1st input terminal 21 of the 1st pulse output circuit $10_{\_1}$ is electrically connected to the 1st signal line 11 for supplying the 1st clock signal CK1, the 2nd input terminal 22 thereof is electrically connected to the 2nd signal line 12 for supplying the 2nd clock signal CK2, and the 3rd input terminal 23 thereof is electrically connected to the 3rd signal line 13 for supplying the 3rd clock signal CK3.

The low-potential drive voltage VSS1 is supplied to the 1st power source line 31, the variable potential drive voltage VSS2 (: the high-potential drive voltage and the low-potential drive voltage are switched to be supplied) is supplied to the 2nd power source line 32, and the high-potential drive voltage VDD is supplied to the 3rd to 6th power source lines 33 to 36. In this embodiment, VSS1 is lower than VDD, and VSS2 is lower than or equal to VDD. Further, the 1st to 4th clock signals CK1 to CK4 each alternate between an H level and an L level at regular intervals; the potential at the H level is VDD and the potential at the L level is VSS1. In addition, VSS1 is 0 for simplification of explanation in this embodiment; however, the present invention is not limited thereto.

In the 1st period 51, the 1st start pulse SP1 is set to the H level (at a in FIG. 7), so that the 5th transistor 105 and the 11th transistor 111 which are electrically connected to the 4th input terminal 24 of the 1st pulse output circuit 10$_{-1}$ are turned on. The 3rd clock signal CK3 is also H level, so that the 9th transistor 109 is also turned on. In addition, the high-potential drive voltage VDD is applied to the gate of the 7th transistor 107, so that the 7th transistor 107 is also turned on (see FIG. 8A).

At that time, since the 5th transistor 105 and the 7th transistor 107 are ON, the potential of the node f1 is increased. Further, since the 11th transistor 111 is ON, the potential of the node f2 is decreased.

The potential of the second electrode of the 5th transistor 105 is at the level obtained by subtracting the threshold voltage of the 5th transistor 105 from the potential VDD of the 3rd power source line 33 where the 1st electrode of the 5th transistor 105 is a source, that is, VDD−Vth105 (Vth105 denotes the threshold voltage of the 5th transistor 105). The potential of the node f1 is at the level obtained by subtracting the threshold voltage of the 7th transistor 107 from the potential (VDD−Vth105) of the 2nd electrode of the 7th transistor 107 where the 2nd electrode of the 7th transistor 107 is a source, that is, VDD−Vth105−Vth107 (Vth107 denotes the threshold voltage of the 7th transistor 107).

At that time, each of the potentials of the gate electrodes of the 1st transistor 101 and the 3rd transistor 103 is (VDD−Vth105−Vth107). When the potential between the gate electrode and the source electrode of the 1st transistor 101 is higher than the threshold voltage of the 1st transistor 101, i.e., when (VDD−Vth105−Vth107)>Vth101 (Vth101 denotes the threshold voltage of the 1st transistor 101), the 1st transistor 101 is turned on. Similarly, when the potential between the gate electrode and the source electrode of the 3rd transistor 103 is higher than the threshold voltage of the 3rd transistor 103, i.e., when (VDD−Vth105−Vth107)>Vth103 (Vth103 denotes the threshold voltage of the 3rd transistor 103), the 3rd transistor 103 is turned on. Consequently, the potentials of the 1st output terminal 25 and the 2nd output terminal 27 are at the L level of the 1st clock signal (CK1).

Figure 7:
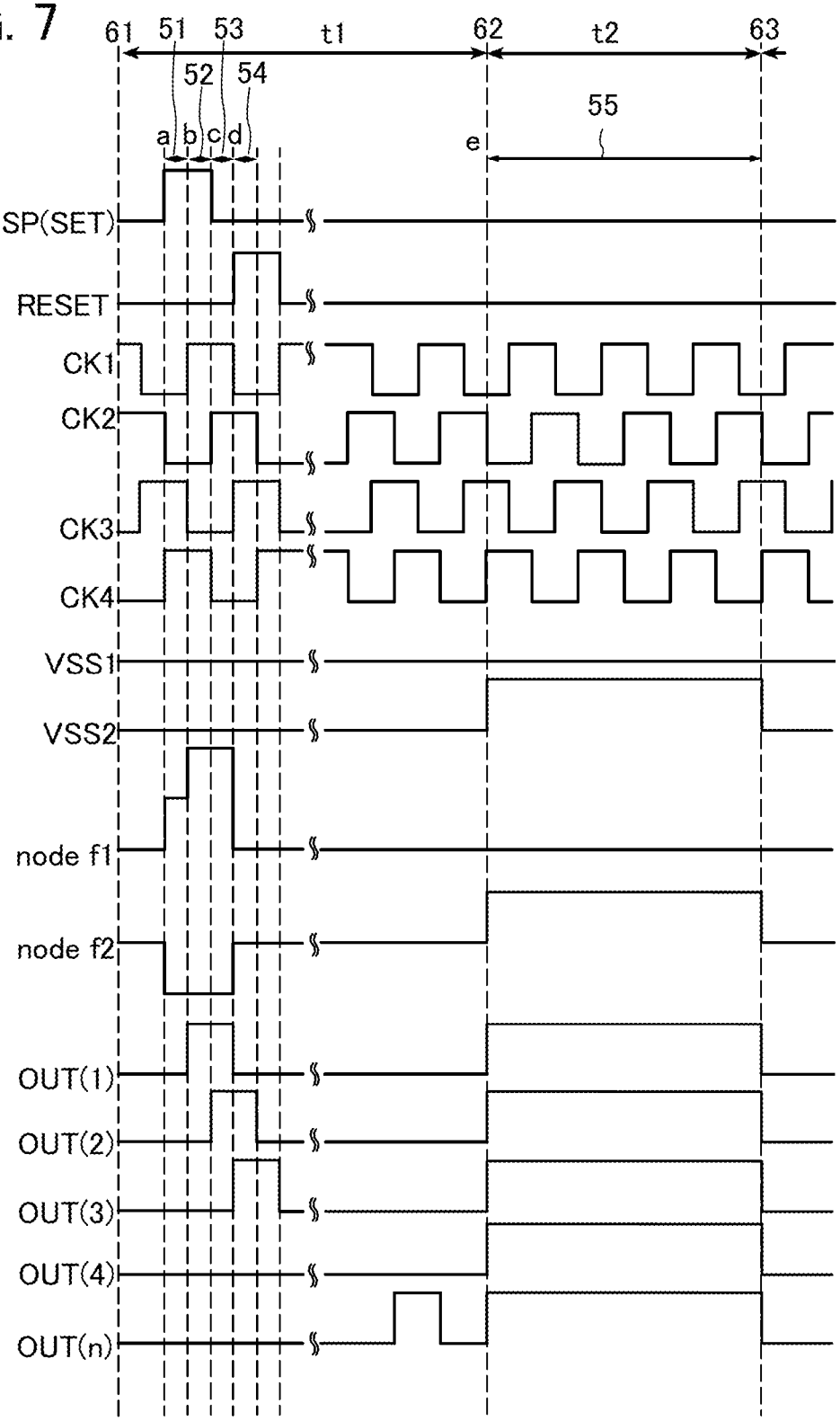
FIG. 7 is a chart showing an operation example of a pulse output circuit.
Figure 8A:
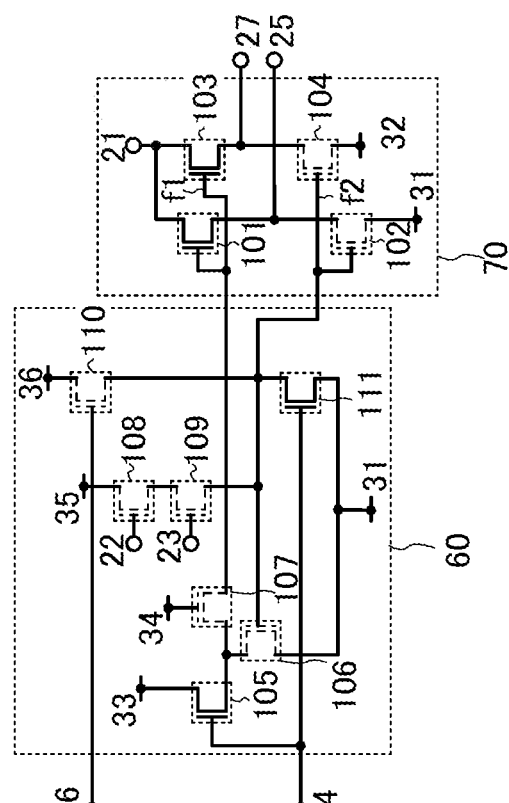
FIGS. 8A and 8B are comparison diagrams showing operation of a pulse output circuit.
Figure 8B:
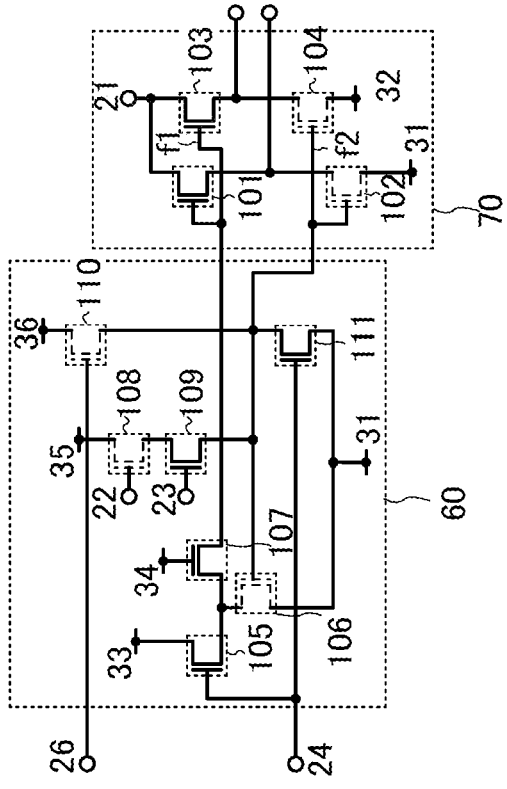
Figure 9A:
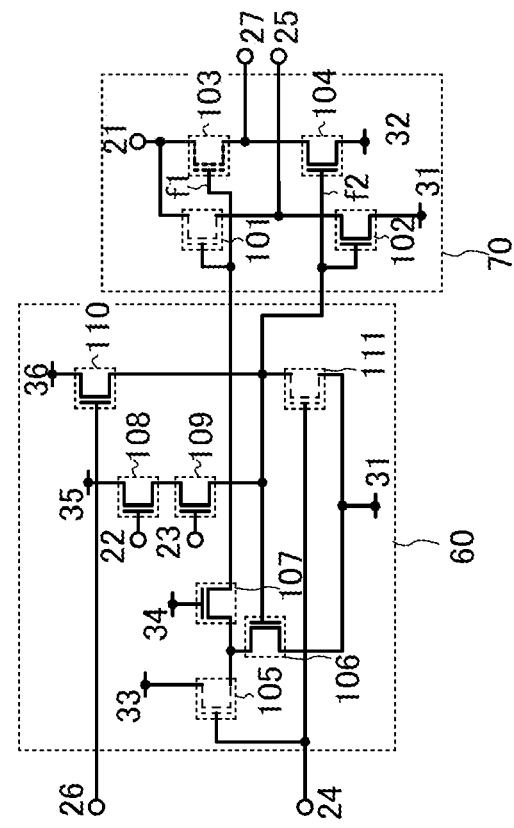
FIGS. 9A and 9B are comparison diagrams showing operation of a pulse output circuit.
Figure 9B:
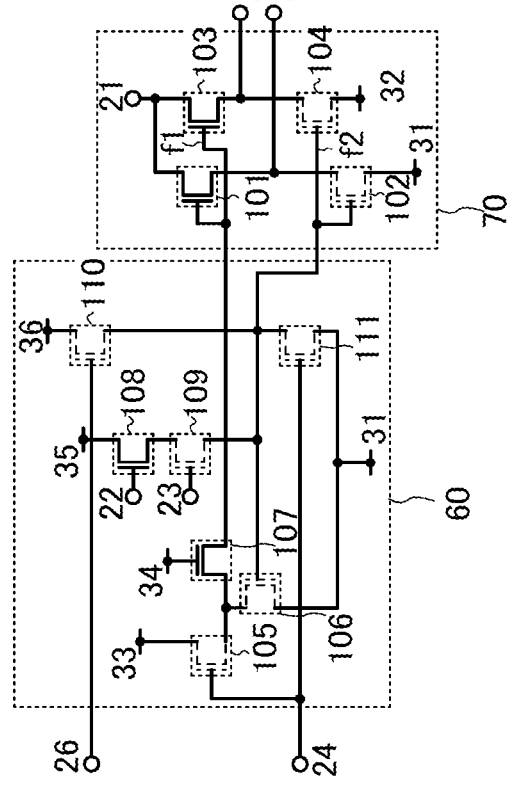

In the 2nd period 52, the level of the 1st input terminal 21 of the 1st pulse output circuit 10$_{-1}$ is changed from the L level to the H level (at b in FIG. 7). Thus, since the 1st transistor 101 and the 3rd transistor 103 are ON, current flows between the source electrode and the drain electrode of the 1st transistor 101 to increase the potential of the 1st output terminal 25, that is, the potential of the 1st output electrode (the source electrode here) of the 1st transistor 101, and current flows between the source electrode and the drain electrode of the 3rd transistor 103 to increase the potential of the 2nd output terminal 27 (OUT(1)), that is, the potential of the second electrode (the source electrode here) of the 3rd transistor 103. With the potential increase of the 1st output terminal 25 and the 2nd output terminal 27, the node f1 being in the floating state is bootstrapped by capacitive coupling of parasitic capacitance formed in a portion where the gate electrode of the 1st transistor 101 overlaps with the source electrode thereof and parasitic capacitance formed in a portion where the gate electrode of the 3rd transistor 103 overlaps with the source electrode thereof, which increases the potentials of the gate electrodes of the 1st transistor 101 and the 3rd transistor 103. Consequently, the potential of the node f1, that is, the potential of the gate electrode of the 1st transistor 101 and the potential of the gate electrode of the 3rd transistor 103 are increased to be higher than (VDD+Vth101) and (VDD+Vth103), respectively, so that the potentials of the 1st output terminal 25 and the 2nd output terminal 27 are at the H level of the 1st clock signal CK1 (see FIG. 8B).

At that time, the level of the 4th input terminal 24 of the 1st pulse output circuit 10$_{-1}$ is at the H level owing to the 1st start pulse SP1, which turns the 11th transistor 111 on to keep the level of the node f2 to the L level. Therefore, defects due to capacitive coupling of the node f2 and the 1st output terminal 25 and capacitive coupling of the node f2 and the 2nd output terminal 27 can be suppressed when each of the potentials of the 1st output terminal 25 and the 2nd output terminal 27 rises from the L level to the H level.

Next, in the 3rd period 53, the 1st start pulse SP1 is changed to the L level (at c in FIG. 7) to turn the 5th transistor 105 and the 11th transistor 111 off. Further, the 1st clock signal CK1 is kept at the H level since the 2nd period 52 and the potential of the node f1 is not changed since the 2nd period 52, so that the signal of the H level is supplied to the 1st electrodes of the 1st transistor 101 and the 3rd transistor 103. Consequently, the potentials of the 1st output terminal 25 and the 2nd output terminal 27 are at the H level (see FIG. 9A). In the 3rd period 53, each transistor which is connected to the node f2 is turned off to make the node f2 to be in the floating state, but the potentials of the 1st output terminal 25 and the 2nd output terminal 27 are not changed, so that defects due to capacitive coupling of the node f2 and the 1st output terminal 25 and capacitive coupling of the node f2 and the 2nd output terminal 27 can be suppressed.

Provision of the 7th transistor 107 whose gate is applied with the high-potential drive voltage (VDD) from the 4th power source line 34 as shown in FIG. 6C provides the following merit with the bootstrapping.

In the case where the 7th transistor 107 whose gate is applied with the high-potential drive voltage (VDD) from the 4th power source line 34 is not provided, increase of the potential of the node f1 due to the bootstrapping increases the potential of the source electrode that is the second electrode of the 5th transistor 105 to be higher than the high-potential drive voltage (VDD). Then, the potential of the source electrode of the 5th transistor 105 is switched to that on the 1st electrode of the 5th transistor 105, that is, the potential on the 3rd power source line 33. Therefore, in the 5th transistor 105, a high bias voltage is applied between the gate electrode and the source electrode and between the gate electrode and the drain electrode in the period of FIG. 9A (the 3rd period 53) to apply a high voltage stress thereon, which might cause deterioration in the transistor.

With the provision of the 7th transistor 107 whose gate is applied with the high-potential drive voltage (VDD), the potential of the second electrode of the 5th transistor 105 can be prevented from being increased as the potential of the node f1 is increased by the bootstrapping. That is, with the provision of the 7th transistor 107, a negative bias voltage applied between the gate electrode and the source electrode of the 5th transistor 105 can be decreased. Accordingly, with the circuit configuration in this embodiment, a negative bias voltage applied between the gate electrode and the source electrode of the 5th transistor 105 can be decreased, so that deterioration of the 5th transistor 105 due to voltage stress can be suppressed.

The 7th transistor 107 may be provided between the 2nd electrode of the 5th transistor 105 and the gate electrode of the 1st transistor 101 so as to be connected by the 1st and 2nd electrodes of the 7th transistor 107, and may be provided between the 2nd electrode of the 5th transistor 105 and the gate electrode of the 3rd transistor 103 so as to be connected by the 1st and 2nd electrodes of the 7th transistor 107. In the case of using a shift register including a plurality of pulse output circuits in this embodiment, the 7th transistor 107 may be omitted in a signal line driver circuit having a larger number of stages than a scan line driver circuit.

Next, in the 4th period 54, the level of the 1st input terminal 21 in the 1st pulse output circuit 10$_{-1}$ is changed to the L level (at d in FIG. 7) to decrease the potentials of the 1st output terminal 25 and the 2nd output terminal 27. Further, the 2nd input terminal 22 is kept at the H level and the level of the 3rd input terminal 23 is changed to the H level in the 4th period 54. The reset signal RESET is input, so that the level of the 5th input terminal 26 becomes the H level to turn the 10th transistor 110 on. With the 10th transistor 110 turned on, the potential of the node f2 is charged to (VDD−Vth110). (The potential of the node f2 is a potential obtained by subtracting the threshold voltage of the 10th transistor 110 from the potential VDD of the 6th power source line 36, that is, (VDD−Vth110) (Vth110 denotes the threshold voltage of the 10th transistor 110)). Consequently, the 2nd transistor 102, the 4th transistor 104, and the 6th transistor 106 are turned on. With the 2nd transistor 102 and the 4th transistor 104 turned on, the potentials of the 1st output terminal 25 and the 2nd output terminal 27 are discharged to the low-potential drive voltage VSS1; with the 6th transistor 106 turned on, the node f1 is discharged to the low-potential drive voltage VSS1. Accordingly, the 1st transistor 101 and the 3rd transistor 103 are turned off, so that the potentials of the 1st output terminal 25 and the 2nd output terminal 27 are changed to the L level (see FIG. 9B).

Next, the normal mode is switched to a batch-ON mode, for which the potential of the 2nd power source line 32 is changed to the H level in the 5th period 55 (at e in FIG. 7). The 1st start pulse SP1 and the reset signal RESET are kept at the L level. At that time, the potential of the 2nd electrode of the 10th transistor 110 is a potential obtained by subtracting the threshold voltage of the 10th transistor 110 from the potential VDD of the 6th power source line 36, (VDD−Vth110) where the 2nd electrode of the 10th transistor 110 is a source (Vth110 denotes the threshold voltage of the 10th transistor 110)). Further, with the H level potential supplied to the 2nd power source line 32, the node f2 being in the floating state is bootstrapped by capacitive coupling of parasitic capacitance formed in a portion where the gate electrode of the 4th transistor 104 overlaps with the source electrode thereof. Accordingly, the potential of the node f2 is increased to (VDD−Vth110+VDD), which can turn the 4th transistor 104 on.

At that time, since the potential of the 1st power source line 31 is kept at the L level and the reset signal RESET is kept at the L level, the potential of the 1st output terminal 25 is at the L level, and that of the 2nd output terminal 27 is at the H level in the 5th period 55.

As shown in FIG. 3, in order to reduce the voltage stress applied to the 2nd transistor 102 in the case where the potential of the 2nd power source line 32 rises to the H level (the batch-ON mode) in the 5th period 55, the transistor 100 may be provided for the node f2.

In this manner, with the configuration in which the 1st power source line 31 is electrically connected to the 2nd electrode of the 2nd transistor 102, the 2nd electrode of the 6th transistor 106, and the 2nd electrode of the 11th transistor 111, and the 2nd power source line 32 is electrically connected to the 2nd electrode of the 4th transistor 104, the potential of the 2nd electrode of the 2nd transistor 102 and that of the 2nd electrode of the 4th transistor 104 can be controlled individually without depending on each other in a period during which the potentials of the 4th input terminal 24 and the 5th input terminal 26 are kept at the L level. In that case, in the output portion 70 of the pulse output circuit in the shift register, the potential supplied from the 1st power source line 31 to the 2nd transistor 102 which is electrically connected to the 1st output terminal 25 which is connected to the pulse output circuit at the next stage is set to the low-potential drive voltage VSS1, and the potential supplied from the 2nd power source line 32 to the 4th transistor 104 which is electrically connected to the 2nd output terminal 27 which is connected to a scan signal line is set to the variable potential drive voltage VSS2.

The variable potential drive voltage VSS2 is set to the low-potential drive voltage VSS1 in the normal mode, and is set to the high-potential drive voltage VDD in the batch-ON mode and to the low-potential drive voltage VSS1 in the batch-OFF mode in the batch mode, whereby the potential of the 2nd output terminal 27 can be controlled as appropriate by changing the potential of the 2nd power source line 32. Accordingly, ON signals (or OFF signals) can be output to the 2nd output terminals 27 connected to respective scan signal lines at the same timing in a batch.

According to the above structure and method, display scan signals (ON signals or OFF signals) can be output to a plurality of scan signal lines at the same timing in a batch in the case of display with single color (e.g., all black or all white), in the driver circuit of the image display device, so that the data writing period can be decreased. Further, a period during which the scan signal line driver portion stops operating can be obtained after a batch display, so that power consumption of the scan signal line driver portion can be reduced by the period. Further, high-speed operation can be realized, which enables the load on the driver circuit portion to be reduced, so that a flicker on the screen can be prevented.

The shift register and the pulse output circuit described in this embodiment can be combined with any structures of a shift register and a pulse output circuit described in other embodiments in this specification. Further, the embodiment of the present invention can also be applied to a semiconductor device. In this specification, the semiconductor device means a device that can function utilizing semiconductor characteristics.

Embodiment 2

In Embodiment 2, structures of a shift register and a pulse output circuit which are different from those described in Embodiment 1 will be described.

In the structures described in Embodiment 1, all of the transistors in the circuits are n-channel transistors; a similar structure may be applied to the case where all of the transistors are p-channel transistors, that is, respective conductivity types are the same in the transistors. In that case, although not shown in particular, in FIG. 1C or FIG. 6C, connection of the transistors may be the same, and the high and low levels of the potential of the power source line may be inverted to the cases described in Embodiment 1. In addition, the H level and the L level of each signal may be inverted to be input. This embodiment of the present invention can also be applied to a semiconductor device.

In this embodiment, the content of each drawing can be combined with or replaced with any other content described in the other embodiments.

Embodiment 3

In Embodiment 3, examples of a transistor applicable to a display device using a shift register of one embodiment of the present invention will be described. There is no particular limitation on the structure of the transistor which can be applied to the display device using the shift register of one embodiment of the present invention; for example, a top gate structure or a bottom gate structure with a staggered structure or a planar structure can be employed. Further, the transistor may have a single gate structure including one channel formation region, a double gate structure including two channel formation regions, or a triple gate structure including three channel formation regions. The transistor may have a dual gate structure including two gate electrode layers positioned over and below a channel region each with a gate insulating layer provided therebetween. FIGS. 18A to 18D illustrate examples of cross-sectional structures of transistors. Transistors illustrated in FIGS. 18A to 18D are transistors using an oxide semiconductor as a semiconductor. Advantages of using an oxide semiconductor is high field-effect mobility and low off-state current obtained even by a relatively easy and low-temperature process: however, it is needless to say that another semiconductor may be alternatively used.

Figure 18A:
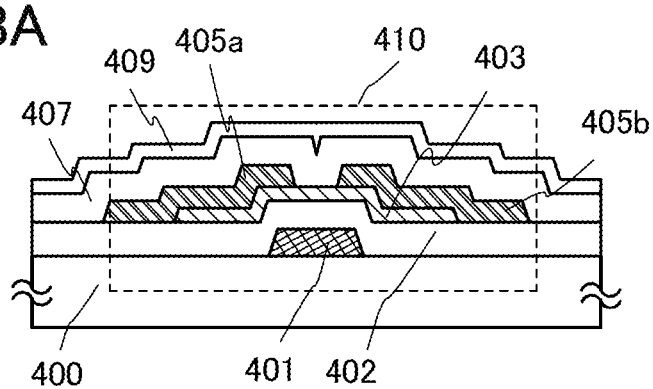
FIGS. 18A to 18D are diagrams illustrating embodiments of a transistor applicable to a display device.

A transistor 410 illustrated in FIG. 18A is one of bottom gate thin film transistors and is also called an inverted staggered thin film transistor.

The transistor 410 includes, over a substrate 400 having an insulating surface, a gate electrode layer 401, a gate insulating layer 402, an oxide semiconductor layer 403, a source electrode layer 405a, and a drain electrode layer 405b. In addition, an insulating film 407 which covers the transistor 410 and is stacked over the oxide semiconductor layer 403 is provided. A protective insulating layer 409 is formed over the insulating film 407.

Figure 18B:
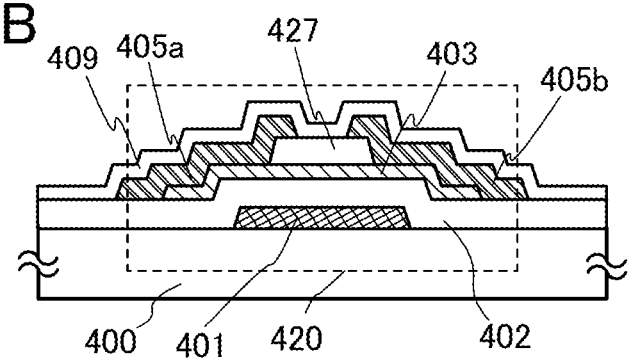

A transistor 420 illustrated in FIG. 18B is one of bottom gate transistors called a channel-protective (channel-stop) transistor and is also called an inverted staggered thin film transistor.

The transistor 420 includes, over the substrate 400 having an insulating surface, the gate electrode layer 401, the gate insulating layer 402, the oxide semiconductor layer 403, an insulating layer 427 which functions as a channel protective layer covering a channel formation region of the oxide semiconductor layer 403, the source electrode layer 405a, and the drain electrode layer 405b. Further, the protective insulating layer 409 is formed to cover the transistor 420.

Figure 18C:
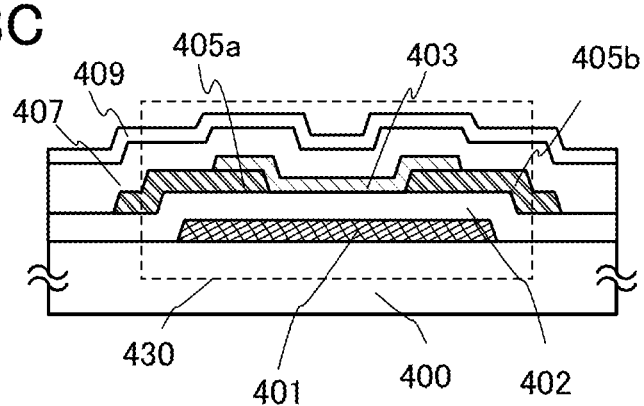

A transistor 430 illustrated in FIG. 18C is a bottom gate thin film transistor and includes, over the substrate 400 having an insulating surface, the gate electrode layer 401, the gate insulating layer 402, the source electrode layer 405a, the drain electrode layer 405b, and the oxide semiconductor layer 403. The insulating film 407 which covers the transistor 430 and is in contact with the oxide semiconductor layer 403 is provided. The protective insulating layer 409 is formed over the insulating film 407.

In the transistor 430, the gate insulating layer 402 is provided over and in contact with the substrate 400 and the gate electrode layer 401; the source electrode layer 405a and the drain electrode layer 405b are provided over and in contact with the gate insulating layer 402. Further, the oxide semiconductor layer 403 is provided over the gate insulating layer 402, the source electrode layer 405a, and the drain electrode layer 405b.

Figure 18D:
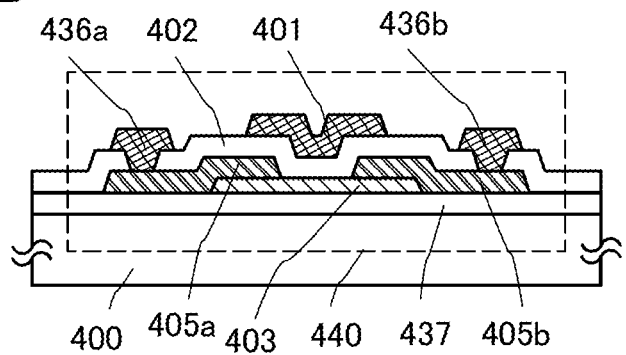

A transistor 440 illustrated in FIG. 18D is one of top gate thin film transistors. The transistor 440 includes, over the substrate 400 having an insulating surface, an insulating layer 437, the oxide semiconductor layer 403, the source electrode layer 405a, the drain electrode layer 405b, the gate insulating layer 402, and the gate electrode layer 401. A wiring layer 436a and a wiring layer 436b are provided in contact with and electrically connected to the source electrode layer 405a and the drain electrode layer 405b, respectively.

In this embodiment, as described above, the oxide semiconductor layer 403 is used as a semiconductor layer. The oxide semiconductor used for the oxide semiconductor layer 403 contains at least one element selected from In, Ga, Sn, and Zn. For example, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a single-component metal oxide such as an In—O-based oxide semiconductor, a Sn—O-based oxide semiconductor, or a Zn—O-based oxide semiconductor, or the like can be used. In addition, any of the above oxide semiconductors may contain an element other than In, Ga, Sn, and Zn, for example, $SiO_2$.

For example, an In—Ga—Zn—O-based oxide semiconductor means an oxide semiconductor containing indium (In), gallium (Ga), and zinc (Zn), and there is no limitation on the composition ratio thereof.

As the oxide semiconductor layer 403, a thin film of a material represented by $InMO_3(ZnO)_m$ (m>0) can be used. Here, M represents one or more metal elements selected from Ga, Al, Mn, and Co. For example, Ga, the combination of Ga and Al, the combination of Ga and Mn, the combination of Ga and Co, or the like is used as M.

In the case where an In—Zn—O-based material is used as the oxide semiconductor, a target to be used has a composition ratio of In:Zn=50:1 to 1:2 in atomic ratio ($In_2O_3$:ZnO=25:1 to 1:4 in molar ratio), preferably In:Zn=20:1 to 1:1 in atomic ratio ($In_2O_3$:ZnO=10:1 to 1:2 in molar ratio), far preferably In:Zn=15:1 to 1.5:1 in atomic ratio ($In_2O_3$:ZnO=15:2 to 3:4 in molar ratio). For example, in a target used for formation of an In—Zn—O-based oxide semiconductor, Z>□1.5X+Y is satisfied where In:Zn:O=X:Y:Z in atomic ratio.

In each of the transistors 410, 420, 430, and 440 using the oxide semiconductor layer 403, the amount of current in an off state (off-state current) can be small. Accordingly, an electrical signal such as an image signal can be retained for a longer period, and a writing interval in the power-on state can be set longer. Accordingly, frequency of refresh operation can be reduced, which leads to reduction in power consumption.

Further, each of the transistors 410, 420, 430, and 440 using the oxide semiconductor layer 403 can exhibit relatively high field-effect mobility and thus can operate at a high speed. Accordingly, by using the transistor in a pixel portion of a display device, a high-quality image can be displayed. Furthermore, the transistors can be separately formed in a circuit portion and the pixel portion over one substrate, which can reduce the number of components of the display device.

Although there is no particular limitation on a substrate that can be used as the substrate 400 having an insulating surface, a glass substrate made of barium borosilicate glass, aluminoborosilicate glass, or the like can be used.

In the bottom gate transistors 410, 420, and 430, an insulating film serving as a base film may be provided between the substrate and the gate electrode layer. The base film has a function of preventing diffusion of an impurity element from the substrate, and can be formed to have a single-layer structure or a stacked-layer structure using one or more of a silicon nitride film, a silicon oxide film, a silicon nitride oxide film, and a silicon oxynitride film.

The gate electrode layer 401 can be formed to have a single-layer structure or a stacked-layer structure using a metal material such as molybdenum, titanium, chromium, tantalum, tungsten, aluminum, copper, neodymium, or scandium, or an alloy material which contains any of these materials as its main component.

The gate insulating layer 402 can be formed to have a single-layer structure or a stacked-layer structure using one or more of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. For example, a silicon nitride layer ($SiN_y$ (y>0)) with a thickness of greater than or equal to 50 nm and less than or equal to 200 nm is formed as a first gate insulating layer by a plasma CVD method, and a silicon oxide layer ($SiO_x$(x>0)) with a thickness of greater than or equal to 5 nm and less than or equal to 300 nm is formed as a second gate insulating layer over the first gate insulating layer, so that a gate insulating layer with a total thickness of 200 nm is formed.

As the conductive film used for the source electrode layer 405a and the drain electrode layer 405b, for example, a film of an element selected from Al, Cr, Cu, Ta, Ti, Mo, and W, a film of an alloy containing any of these elements as a component, an alloy film containing these elements in combination, or the like can be used. The conductive film may have a structure in which a high-melting-point metal layer of Ti, Mo, W, or the like is stacked over and/or below a metal layer of Al, Cu, or the like. An Al material in which an element (e.g., Si, Nd, or Sc) which prevents generation of hillocks and whiskers in an Al film is added may be used in order to improve the heat resistance.

A material similar to that for the source electrode layer 405a and the drain electrode layer 405b can be used for a conductive film used for the wiring layer 436a and the wiring layer 436b which are respectively connected to the source electrode layer 405a and the drain electrode layer 405b.

Alternatively, the conductive film to be the source and drain electrode layers 405a and 405b (including a wiring layer formed using the same layer as the source and drain electrode layers) may be formed using conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon or silicon oxide is contained can be used.

As the insulating film 407, 427, 437, typically, an inorganic insulating film such as a silicon oxide film, a silicon oxynitride film, an aluminum oxide film, or an aluminum oxynitride film can be used.

For the protective insulating layer 409, an inorganic insulating film such as a silicon nitride film, an aluminum nitride film, a silicon nitride oxide film, or an aluminum nitride oxide film can be used.

Further, a planarization insulating film may be formed over the protective insulating layer 409 so that surface roughness due to the transistor is reduced. For the planarization insulating film, an organic material such as polyimide, acrylic, or benzocyclobutene can be used. As well as such an organic material, a low-dielectric constant material (a low-k material) or the like can be used. A plurality of insulating films formed from these materials may be stacked to form the planarization insulating film.

In this manner, in this embodiment, with the transistor including the oxide semiconductor layer whose off-state current is small, a display device with low power consumption can be provided.

Embodiment 4

In Embodiment 4, an example of the transistor including an oxide semiconductor layer and an example of a manufacturing method thereof will be described in detail with reference to FIGS. 19A to 19E. The same portions as or portions having functions similar to those in the above embodiments can be formed in a manner similar to those described in the above embodiments, and thus repetitive description is omitted. In addition, detailed description of the same portions is omitted.

FIGS. 19A to 19E illustrate an example of a cross-sectional structure of a transistor. A transistor 510 illustrated in FIGS. 19A to 19E is a bottom-gate inverted-staggered thin film transistor which is similar to the transistor 410 illustrated in FIG. 18A.

An oxide semiconductor used for a semiconductor layer in this embodiment is an i-type (intrinsic) oxide semiconductor or a substantially i-type (intrinsic) oxide semiconductor, which is obtained in such a manner that hydrogen, which is an n-type impurity, is removed from an oxide semiconductor so that the oxide semiconductor is highly purified so as to contain as few impurities that are not main components of the oxide semiconductor as possible. In other words, a feature of this embodiment is that a purified i-type (intrinsic) semiconductor or a semiconductor close thereto is obtained not by adding an impurity but by removing an impurity such as hydrogen or water as much as possible. Thus, an oxide semiconductor layer included in the transistor 510 is a highly purified, electrically i-type (intrinsic) oxide semiconductor layer.

In addition, the highly purified oxide semiconductor includes extremely few carriers (close to zero); the carrier concentration thereof is less than $1\times10^{14}/cm^3$, preferably less than $1\times10^{12}/cm^3$, far preferably less than $1\times10^{11}/cm^3$.

Since the number of carriers in the oxide semiconductor is extremely small, the off-state current of the transistor can be reduced. The smaller the amount of off-state current is, the better.

Specifically, in the thin film transistor including the oxide semiconductor layer, the off-state current density per micrometer in a channel width at room temperature can be less than or equal to 10 aA/μm ($1\times10^{-17}$ A/μm), far less than or equal to 1 aA/μm ($1\times10^{-18}$ A/μm), or still far less than or equal to 10 zA/μm ($1\times10^{-20}$ A/μm).

By using the transistor whose current in the off state (off-current value) is extremely small as a transistor in a pixel portion, refresh operation in a still image area can be performed with a small frequency of image data writing.

The on-state current of the transistor 510 including the above-described oxide semiconductor layer hardly depends on temperature and the off-state current remains very small.

A process for manufacturing the transistor 510 over a substrate 505 are described below with reference to FIGS. 19A to 19E.

First, a conductive film is formed over the substrate 505 having an insulating surface, and then a gate electrode layer 511 is formed by a first photolithography step. A resist mask may be formed by an inkjet method. Formation of the resist mask by an inkjet method needs no photomask; thus, manufacturing cost can be reduced.

As the substrate 505 having an insulating surface, a substrate similar to the substrate 400 described in Embodiment 3 can be used. In this embodiment, a glass substrate is used as the substrate 505.

An insulating film which serves as a base film may be provided between the substrate 505 and the gate electrode layer 511. The base film has a function of preventing diffusion of impurity elements from the substrate 505 and can be formed to have a single-layer structure or a stacked-layer structure using one or more selected from a silicon nitride film, a silicon oxide film, a silicon nitride oxide film, and a silicon oxynitride film.

The gate electrode layer 511 can be formed to have a single-layer structure or a stacked-layer structure using a metal material such as molybdenum, titanium, tantalum, tungsten, aluminum, copper, neodymium, or scandium, or an alloy which contains any of these materials as a main component.

Next, a gate insulating layer 507 is formed over the gate electrode layer 511. The gate insulating layer 507 can be formed to have a single-layer structure or a stacked-layer structure using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer and/or a hafnium oxide layer by a plasma CVD method, a sputtering method, or the like.

As the oxide semiconductor in this embodiment, an oxide semiconductor which is i-type or substantially i-type with impurities removed is used. Such a highly purified oxide semiconductor is highly sensitive to an interface state and interface charge; thus, an interface between the oxide semiconductor layer and the gate insulating layer is important. For that reason, the gate insulating layer that is to be in contact with the highly-purified oxide semiconductor needs to have high quality.

For example, a high-density plasma CVD method using microwaves (e.g., a frequency of 2.45 GHz) is preferably adopted because an insulating layer can be dense and can have high withstand voltage and high quality. In that case, the highly-purified oxide semiconductor and the high-quality gate insulating layer are in close contact with each other, whereby the interface state density can be reduced to realize favorable interface characteristics.

Needless to say, another film formation method such as a sputtering method or a plasma CVD method can be employed as long as it enables formation of a high-quality insulating layer as a gate insulating layer. Further, an insulating layer whose film quality and characteristic of the interface between the insulating layer and the oxide semiconductor are improved by heat treatment which is performed after formation of the insulating layer may be formed as the gate insulating layer. In any case, any insulating layer may be used as long as the insulating layer has characteristics of enabling reduction in interface state density of the interface between the insulating layer and the oxide semiconductor and formation of a favorable interface as well as having favorable film quality as a gate insulating layer.

Further, in order that hydrogen, hydroxyl group, and moisture are contained as little as possible in the gate insulating layer 507 and an oxide semiconductor film 530, it is preferable that the substrate 505 provided with the gate electrode layer 511 or the substrate 505 provided with the gate electrode layer 511 and the gate insulating layer 507 be preheated in a preheating chamber of a sputtering apparatus as pretreatment for the formation of the oxide semiconductor film 530 to eliminate and remove impurities such as hydrogen and moisture adsorbed on the substrate 505. As an exhaustion unit provided in the preheating chamber, a cryopump is preferable. This preheating treatment can be omitted. Further, this preheating treatment may be performed in a similar manner on the substrate 505 provided with the components up to and including a source electrode layer 515a and a drain electrode layer 515b, before formation of an insulating layer 516.

Figure 19A:
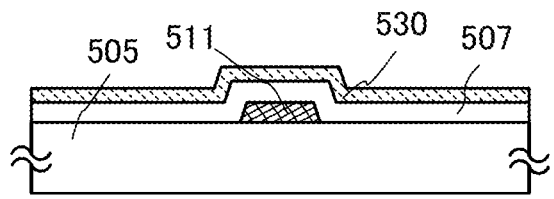
FIGS. 19A to 19E are diagrams illustrating one embodiment of a method for manufacturing a transistor applicable to a display device.
Figure 19B:
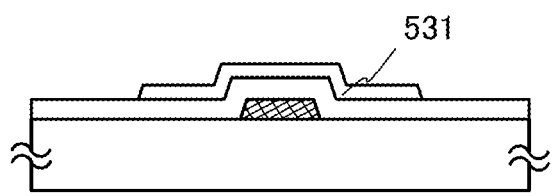

Next, over the gate insulating layer 507, the oxide semiconductor film 530 with a thickness of greater than or equal to 2 nm and less than or equal to 200 nm, preferably greater than or equal to 5 nm and less than or equal to 30 nm is formed (see FIG. 19A).

Note that before the oxide semiconductor film 530 is formed by a sputtering method, reverse sputtering in which plasma is generated by introduction of an argon gas is preferably performed to remove powdery substances (also referred to as particles or dust) attached to a surface of the gate insulating layer 507. The reverse sputtering refers to a method in which, without application of a voltage to a target side, an RF power source is used for application of a voltage to a substrate side in an argon atmosphere to modify a surface. Instead of an argon atmosphere, a nitrogen atmosphere, a helium atmosphere, an oxygen atmosphere, or the like may be used.

The oxide semiconductor used for the oxide semiconductor film 530 includes at least one element selected from In, Ga, Sn, and Zn. For example, any oxide semiconductor such as the four-component metal oxide, the three-component metal oxide, the two-component metal oxide, or the single-component metal oxide described in Embodiment 3 can be used. In addition, the above-described oxide semiconductor may contain an element other than In, Ga, Sn, and Zn, for example, $SiO_2$.

For example, an In—Ga—Zn—O-based oxide semiconductor means an oxide semiconductor containing indium (In), gallium (Ga), and zinc (Zn), and there is no limitation on the composition ratio thereof.

For the oxide semiconductor layer, a thin film formed using a material expressed by $InMO_3(ZnO)_m$ (m>0) can be used. Here, M represents one or more metal elements selected from Zn, Ga, Al, Mn, and Co. For example, Ga, the combination of Ga and Al, the combination of Ga and Mn, the combination of Ga and Co, or the like can be used as M.

In this embodiment, the oxide semiconductor film 530 is formed by a sputtering method with the use of an In—Ga—Zn—O-based oxide semiconductor target. The cross-sectional view at this stage corresponds to FIG. 19A. The oxide semiconductor film 530 can be formed by a sputtering method in a rare gas (typically argon) atmosphere, an oxygen atmosphere, or a mixed atmosphere of a rare gas and oxygen.

In the case where an In—Zn—O-based material is used as the oxide semiconductor, a target to be used has a composition ratio of In:Zn=50:1 to 1:2 in atomic ratio ($In_2O_3$:ZnO=25:1 to 1:4 in molar ratio), preferably In:Zn=20:1 to 1:1 in atomic ratio ($In_2O_3$:ZnO=10:1 to 1:2 in molar ratio), far preferably In:Zn=15:1 to 1.5:1 in atomic ratio ($In_2O_3$:ZnO=15:2 to 3:4 in molar ratio). For example, in a target used for formation of an In—Zn—O-based oxide semiconductor, Z>□1.5X+Y is satisfied where In:Zn:O=X:Y:Z in atomic ratio. The filling rate of the oxide target is 90% to 100%, preferably 95% to 100%. Such a metal oxide target with high filling rate enables the deposited oxide semiconductor film to be dense.

It is preferable that a high-purity gas from which impurities such as hydrogen, water, hydroxyl group, or hydride have been removed be used as a sputtering gas used for the formation of the oxide semiconductor film 530.

The substrate is held in a deposition chamber kept under reduced pressure, and the substrate temperature is set to a temperature higher than or equal to 100° C. and lower than or equal to 600° C., preferably higher than or equal to 200° C. and lower than or equal to 400° C. The oxide semiconductor film is formed while the substrate is heated, the concentration of impurities included in the oxide semiconductor film can be reduced. In addition, damage by sputtering can be reduced. Then, a sputtering gas from which hydrogen and moisture have been removed is introduced into the deposition chamber while moisture remaining therein is removed, so that the oxide semiconductor film 530 is formed over the substrate 505 with the use of the above target. In order to remove moisture remaining in the deposition chamber, an entrapment vacuum pump such as a cryopump, an ion pump, or a titanium sublimation pump is preferably used. The evacuation unit may be a turbo pump provided with a cold trap. In the deposition chamber which is evacuated with the cryopump, a hydrogen atom, a compound containing a hydrogen atom, such as water ($H_2O$), (far preferably, also a compound containing a carbon atom), and the like are removed, whereby the concentration of impurities in the oxide semiconductor film formed in the deposition chamber can be reduced.

According to one example of the deposition condition, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). A pulsed direct-current power source is preferably used, in which case powder substances (also referred to as particles or dust) that are generated in film deposition can be reduced and the film thickness can be uniform.

Next, the oxide semiconductor film 530 is processed into an island-shaped oxide semiconductor layer by a second photolithography step. A resist mask for forming the island-shaped oxide semiconductor layer may be formed by an ink-jet method. Formation of the resist mask by an inkjet method needs no photomask; thus, manufacturing cost can be reduced.

In the case where a contact hole is formed in the gate insulating layer 507, a step of forming the contact hole can be performed at the same time as processing of the oxide semiconductor film 530.

Note that etching of the oxide semiconductor film 530 may be dry etching, wet etching, or both dry etching and wet etching. As an etchant used for wet etching of the oxide semiconductor film 530, for example, a mixed solution of phosphoric acid, acetic acid, and nitric acid, or an ammonium hydroxide-hydrogen peroxide mixture (a 31 wt % hydrogen peroxide solution: 28 wt % ammonia water: water=5:2:2) can be used. ITO07N (produced by KANTO CHEMICAL CO., INC.) may be used as well.

Next, the oxide semiconductor layer is subjected to first heat treatment. The oxide semiconductor layer can be dehydrated or dehydrogenated by this first heat treatment. The temperature of the first heat treatment is higher than or equal to 400° C. and lower than or equal to 750° C., preferably higher than or equal to 400° C. and lower than the strain point of the substrate. In this embodiment, the substrate is put in an electric furnace which is a kind of heat treatment apparatus and heat treatment is performed on the oxide semiconductor layer at 450° C. for one hour in a nitrogen atmosphere, and then, water or hydrogen is prevented from entering the oxide semiconductor layer by preventing exposure to the air; thus, an oxide semiconductor layer 531 is obtained (see FIG. 19B).

The heat treatment apparatus is not limited to an electric furnace; a device for heating an object by heat conduction or heat radiation from a heating element such as a resistance heating element may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object by heat treatment, such as nitrogen or a rare gas like argon, is used.

For example, as the first heat treatment, GRTA may be performed, according to which the substrate is moved into an inert gas heated to a high temperature as high as 650° C. to 700° C., heated for several minutes, and moved out of the inert gas heated to the high temperature.

In the first heat treatment, it is preferable that water, hydrogen, and the like be not contained in the atmosphere of nitrogen or the rare gas such as helium, neon, or argon. It is preferable that the purity of nitrogen or the rare gas such as helium, neon, or argon which is introduced into the heat treatment apparatus be set to be 6N (99.9999%) or higher, preferably 7N (99.99999%) or higher (that is, the concentration of impurities is 1 ppm or less, preferably 0.1 ppm or less).

After the oxide semiconductor layer is heated in the first heat treatment, a high-purity oxygen gas, a high-purity $N_2O$ gas, or ultra-dry air (having a dew point lower than or equal to −40° C., preferably lower than or equal to −60° C.) may be introduced into the furnace while the heating temperature is being maintained or being decreased. It is preferable that the oxygen gas or the $N_2O$ gas do not include water, hydrogen, and the like. It is preferable that the purity of the oxygen gas or the $N_2O$ gas that is introduced into the heat treatment apparatus be greater than or equal to 6N, preferably greater than or equal to 7N (i.e., the concentration of impurities in the oxygen gas or the $N_2O$ gas is 1 ppm or less, preferably 0.1 ppm or less). The oxygen gas or the $N_2O$ gas act to supply oxygen which is a main component of the oxide semiconductor and which has been reduced at the same time as the step for removing impurities by dehydration or dehydrogenation, so that the oxide semiconductor layer is highly purified and made to be electrically i-type (intrinsic).

The first heat treatment for the oxide semiconductor layer can also be performed on the oxide semiconductor film 530 which has not been processed into the island-shaped oxide semiconductor layer. In that case, the substrate is taken out from the heating apparatus after the first heat treatment, and then a photolithography step is performed thereon.

The first heat treatment may be performed at either of the following timings without limitation to the above-described timing as long as it is performed after the oxide semiconductor layer is formed: after a source electrode layer and a drain electrode layer are formed over the oxide semiconductor layer; after an insulating layer is formed over the source electrode layer and the drain electrode layer.

In the case where a contact hole is formed in the gate insulating layer 507, the formation of the contact hole may be performed either before or after the first heat treatment is performed on the oxide semiconductor film 530.

Further, as the oxide semiconductor layer, an oxide semiconductor layer having a crystal region with a large thickness (a single crystal region), that is, a crystal region which is c-axis-aligned perpendicularly to a surface of the film may be formed by performing film deposition twice and heat treatment twice regardless of the material of a base component such as an oxide, a nitride, a metal, or the like. For example, a first oxide semiconductor film with a thickness of greater than or equal to 3 nm and less than or equal to 15 nm is formed and then first heat treatment is performed thereon at a temperature higher than or equal to 450° C. and lower than or equal to 850° C., preferably higher than or equal to 550° C. and lower than or equal to 750° C. in an atmosphere of nitrogen, oxygen, a rare gas, or dry air, whereby a first oxide semiconductor film which includes a crystalline region (including plate-like crystals) in a region including its surface is formed. Then, a second oxide semiconductor film which is thicker than the first oxide semiconductor film is formed and then second heat treatment is performed thereon at a temperature higher than or equal to 450° C. and lower than or equal to 850° C., preferably higher than or equal to 600° C. and lower than or equal to 700° C., so that crystal growth proceeds upward with the use of the first oxide semiconductor film as a seed of the crystal growth, whereby the whole second oxide semiconductor film is crystallized. In this manner, an oxide semiconductor layer which includes a thick crystalline region may be formed.

Next, a conductive film which serves as a source electrode layer and a drain electrode layer (including a wiring formed using the same layer as the source electrode layer and the drain electrode layer) is formed over the gate insulating layer 507 and the oxide semiconductor layer 531. As the conductive film serving as the source electrode layer 515a and the drain electrode layer 515b, the material used for the source electrode layer 405a and the drain electrode layer 405b which is described in Embodiment 3 can be used.

Figure 19C:
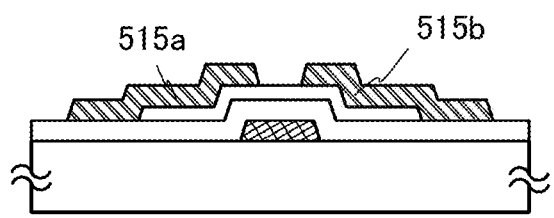

A resist mask is formed over the conductive film by a third photolithography step, and is selectively etched to form the source electrode layer 515a and the drain electrode layer 515b, and then, the resist mask is removed (see FIG. 19C).

Light exposure at the time of the formation of the resist mask in the third photolithography step may be performed using ultraviolet light, KrF laser light, or ArF laser light. A channel length L of a transistor is determined by a distance between respective bottom ends of the source electrode layer and the drain electrode layer, which are adjacent to each other over the oxide semiconductor layer 531. In the case where light exposure is performed for a channel length L of less than 25 nm, the light exposure at the time of the formation of the resist mask in the third photolithography step may be performed using extreme ultraviolet light having an extremely short wavelength of several nanometers to several tens of nanometers. In the light exposure with extreme ultraviolet light, the resolution is high and the focus depth is large. Therefore, the channel length L of the transistor can be greater than or equal to 10 nm and less than or equal to 1000 nm, which enables high operation speed of a circuit.

In order to reduce the number of photomasks used in a photolithography step and reduce the number of photolithography steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed using one multi-tone mask. Thus, the number of photomasks can be reduced and the number of corresponding photolithography steps can be also reduced, whereby simplification of a process can be realized.

It is preferable that etching conditions be optimized so as not to etch and divide the oxide semiconductor layer 531 when the conductive film is etched. However, it is difficult to obtain conditions under which only the conductive film is etched but the oxide semiconductor layer 531 is not etched at all. Therefore, in some cases, part of the oxide semiconductor layer 531 is etched to be an oxide semiconductor layer having a groove (a depressed portion) at the time of etching of the conductive film.

In this embodiment, a Ti film is used as the conductive film and an In—Ga—Zn—O-based oxide semiconductor is used for the oxide semiconductor layer 531, and therefore, an ammonia hydrogen peroxide mixture (a mixed solution of ammonia, water, and a hydrogen peroxide solution) is used as an etchant.

Next, plasma treatment using a gas such as $N_2O$, $N_2$, or Ar, may be performed thereof to remove water or the like adsorbed to a surface of an exposed portion of the oxide semiconductor layer. In the case where the plasma treatment is performed, the insulating layer 516 which serves as a protective insulating film in contact with part of the oxide semiconductor layer is formed without being exposed to the air.

The insulating layer 516 can be formed to a thickness of at least 1 nm by a method by which impurities such as water and hydrogen do not enter the insulating layer 516, such as a sputtering method. When hydrogen is contained in the insulating layer 516, entry of the hydrogen to the oxide semiconductor layer or extraction of oxygen in the oxide semiconductor layer by the hydrogen is caused, whereby a backchannel of the oxide semiconductor layer comes to be n-type (to have a lower resistance); thus, a parasitic channel might be formed. Therefore, it is important that a formation method in which hydrogen is not used be employed so that the insulating layer 516 contains hydrogen as little as possible.

In this embodiment, a silicon oxide film is formed to a thickness of 200 nm as the insulating layer 516 by a sputtering method. The substrate temperature in the film formation may be higher than or equal to room temperature and lower than or equal to 300° C.: in this embodiment, 100° C. The silicon oxide film can be formed by a sputtering method in a rare gas (typically, argon) atmosphere, an oxygen atmosphere, or a mixed atmosphere of a rare gas and oxygen. As a target, a silicon oxide target or a silicon target may be used. For example, the silicon oxide film can be formed using a silicon target by a sputtering method in an atmosphere containing oxygen. As the insulating layer 516 which is formed in contact with the oxide semiconductor layer, an inorganic insulating film which does not contain impurities such as moisture, a hydrogen ion, and OH− and blocks the entry of these impurities from the outside is used. Typically, a silicon oxide film, a silicon oxynitride film, an aluminum oxide film, an aluminum oxynitride film, or the like is used.

As in the case of forming the oxide semiconductor film 530, an entrapment vacuum pump (e.g., a cryopump) is preferably used in order to remove moisture remaining in a deposition chamber used for forming the insulating layer 516. The insulating layer 516 may be formed in the deposition chamber in which evacuation has been performed with a cryopump, whereby the concentration of impurities in the insulating layer 516 can be reduced. A turbo pump provided with a cold trap may be alternatively used as an evacuation unit for removing moisture remaining in the deposition chamber used for forming the insulating layer 516.

It is preferable that a high-purity gas from which impurities such as hydrogen, water, hydroxyl group, or hydride have been removed be used as a sputtering gas for the formation of the insulating layer 516.

Next, second heat treatment (preferably at 200° C. to 400° C., for example, 250° C. to 350° C.) is performed in an inert gas atmosphere, a dry air atmosphere, or an oxygen gas atmosphere. For example, the second heat treatment is performed in a nitrogen atmosphere at 250° C. for one hour. According to the second heat treatment, part of the oxide semiconductor layer (a channel formation region) is heated while being in contact with the insulating layer 516.

Through the above process, the first heat treatment is performed on the oxide semiconductor film, whereby impurities such as hydrogen, moisture, hydroxyl group, or hydride (also referred to as a hydrogen compound) can be intentionally eliminated from the oxide semiconductor layer and oxygen, which is one of main components of the oxide semiconductor but has been reduced through the step of eliminating the impurities, can be supplied. Accordingly, the oxide semiconductor layer is highly purified and is made to be electrically i-type (intrinsic).

Figure 19D:
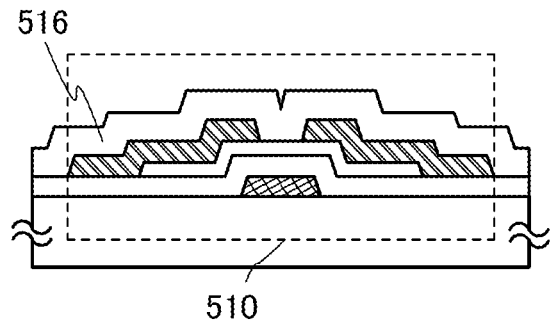
Figure 19E:
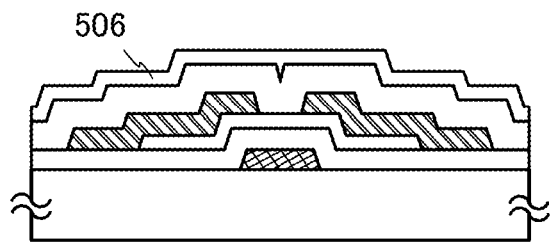

Through the above steps, the transistor 510 is formed (see FIG. 19D).

A silicon oxide layer having a lot of defects may be used as the insulating layer 516, so that heat treatment after formation of the silicon oxide layer has an effect in diffusing an impurity such as hydrogen, moisture, a hydroxyl group, or hydride contained in the oxide semiconductor layer to the oxide insulating layer to further reduce impurities contained in the oxide semiconductor layer.

A protective insulating layer 506 may be formed over the insulating layer 516. For example, a silicon nitride film is formed by an RF sputtering method. The RF sputtering method, which has high productivity, is preferable as a film formation method of the protective insulating layer. As the protective insulating layer, an inorganic insulating film which does not contain impurities such as moisture and blocks the entry of the impurities from the outside is used; for example, a silicon nitride film, an aluminum nitride film, or the like is used. In this embodiment, a protective insulating layer is formed using a silicon nitride film as the protective insulating layer 506 (see FIG. 19E).

In this embodiment, as the protective insulating layer 506, a silicon nitride film is formed by heating the substrate 505 provided with the components up to and including the insulating layer 516, to a temperature of 100° C. to 400° C., introducing a sputtering gas containing high-purity nitrogen from which hydrogen and moisture have been removed, and using a target of silicon semiconductor. In this case, the protective insulating layer 506 is preferably deposited removing residual moisture in a treatment chamber, similarly to the insulating layer 516.

After the formation of the protective insulating layer, heat treatment may be further performed at a temperature higher than or equal to 100° C. and lower than or equal to 200° C. in the air for 1 hour to 30 hours. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature.

In this manner, the transistor including the highly-purified oxide semiconductor layer, which is manufactured in accordance with this embodiment, is used, whereby current in an off state (off-state current) can be further reduced. Accordingly, an electric signal such as an image signal can be retained for a longer period and a writing interval can be set longer. Therefore, the frequency of refresh operation can be reduced, which increases a reduction in power consumption.

In addition, since the transistor including the highly-purified oxide semiconductor layer exhibits high field-effect mobility, which enables high-speed operation. Accordingly, with the transistor in a pixel portion of a display device, a high-quality image can be displayed. Further, the transistors can be separately formed in a circuit portion and the pixel portion over one substrate, and thus the number of components of the display device can be reduced.

Embodiment 4 can be implemented in appropriate combination with any other structure described in the other embodiments.

Embodiment 5

A display device can be manufactured using the shift register described in any one of Embodiments 1 and 2. Further, part or all of a driver circuitry which includes the transistor can be formed over a substrate where a pixel portion is formed, whereby a system-on-panel can be obtained.

Figure 10A:
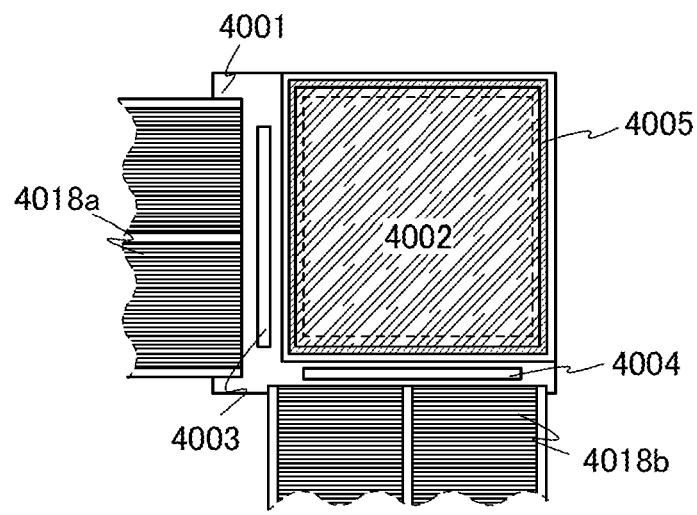
FIGS. 10A to 10C are views illustrating embodiments of a display device.

In FIG. 10A, a sealant 4005 is provided so as to surround a pixel portion 4002 provided over a first substrate 4001. In FIG. 10A, a scan line driver circuit 4004 and a signal line driver circuit 4003 each are formed using a single crystal semiconductor film or a polycrystalline semiconductor film over another substrate, and mounted in a region different from the region surrounded by the sealant 4005 over the first substrate 4001. Various signals and potential are supplied to the signal line driver circuit 4003 and the scan line driver circuit 4004 and the pixel portion 4002 from flexible printed circuits (FPCs) 4018a and 4018b.

Figure 10B:
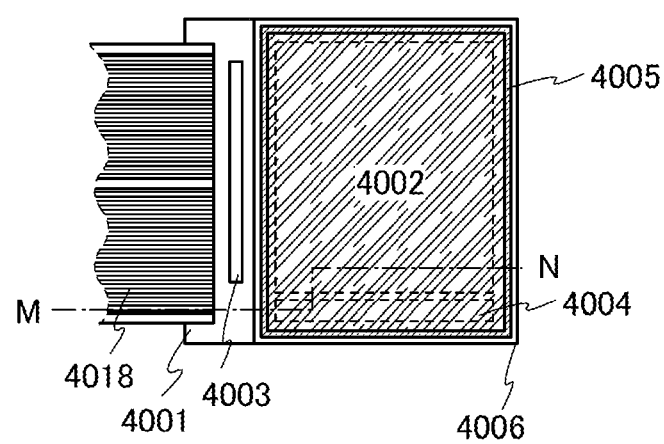
Figure 10C:
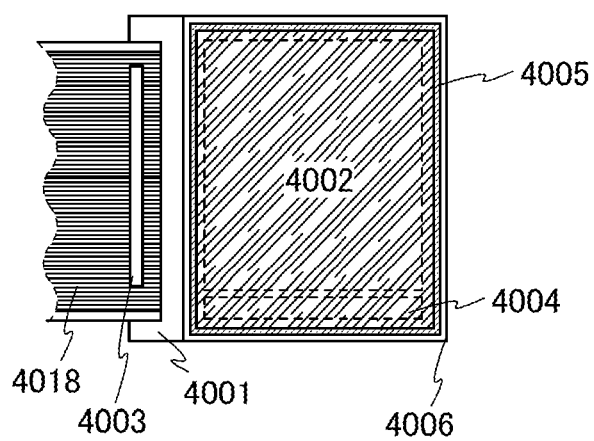

In FIGS. 10B and 10C, the sealant 4005 is provided so as to surround the pixel portion 4002 and the scan line driver circuit 4004 which are provided over the first substrate 4001. A second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 10B and 10C, the signal line driver circuit 4003 which is formed using a single crystal semiconductor film or a polycrystalline semiconductor film over another substrate is mounted in a region that is different from the region surrounded by the sealant 4005 over the first substrate 4001. In FIGS. 10B and 10C, various signals and potentials are supplied to the signal line driver circuit 4003 which is separately formed, the scan line driver circuit 4004, and the pixel portion 4002 from an FPC 4018.

Although FIGS. 10B and 10C illustrate the example in which the signal line driver circuit 4003 is formed separately and mounted on the first substrate 4001, an embodiment of the present invention is not limited to this structure. The scan line driver circuit may be separately formed and then mounted, or part of the signal line driver circuit or part of the scan line driver circuit may be separately formed and then mounted.

A connection method of a separately formed driver circuit is not particularly limited; a chip on glass (COG) method, a wire bonding method, a tape automated bonding (TAB) method, or the like can be used. FIG. 10A illustrates the example in which the signal line driver circuit 4003 and the scan line driver circuit 4004 are mounted by a COG method; FIG. 10B illustrates the example in which the signal line driver circuit 4003 is mounted by a COG method; FIG. 10C illustrates the example in which the signal line driver circuit 4003 is mounted by a TAB method.

The display device includes in its category a panel with a display element sealed and a module with an IC or the like including a controller mounted on the panel.

Note that the display device in this specification also means an image display device or a light source (including a lighting device). Further, the display device also includes in its category the following modules: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The shift register descried in any of Embodiments 1 and 2 can be applied to the pixel portion, the scan line driver circuit, and the signal line drive circuit provided over the first substrate. With the shift register, display scan signals (ON signals or OFF signals) can be output at the same timing in a batch to a plurality of scan signal lines in the case of display with single color (e.g., all black or all white), which enables the data writing period to be decreased. Further, a period during which a scan signal line driver portion stops operating can be provided after a batch display, so that power consumption of the scan signal line driver portion can be reduced by the period. Further, high-speed operation can be realized, which enables a load on a driver circuit portion to be reduced, so that a flicker on the screen can be prevented.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. A display medium whose contrast is changed by an electric effect, such as electronic ink, can be used as well.

Figure 11:
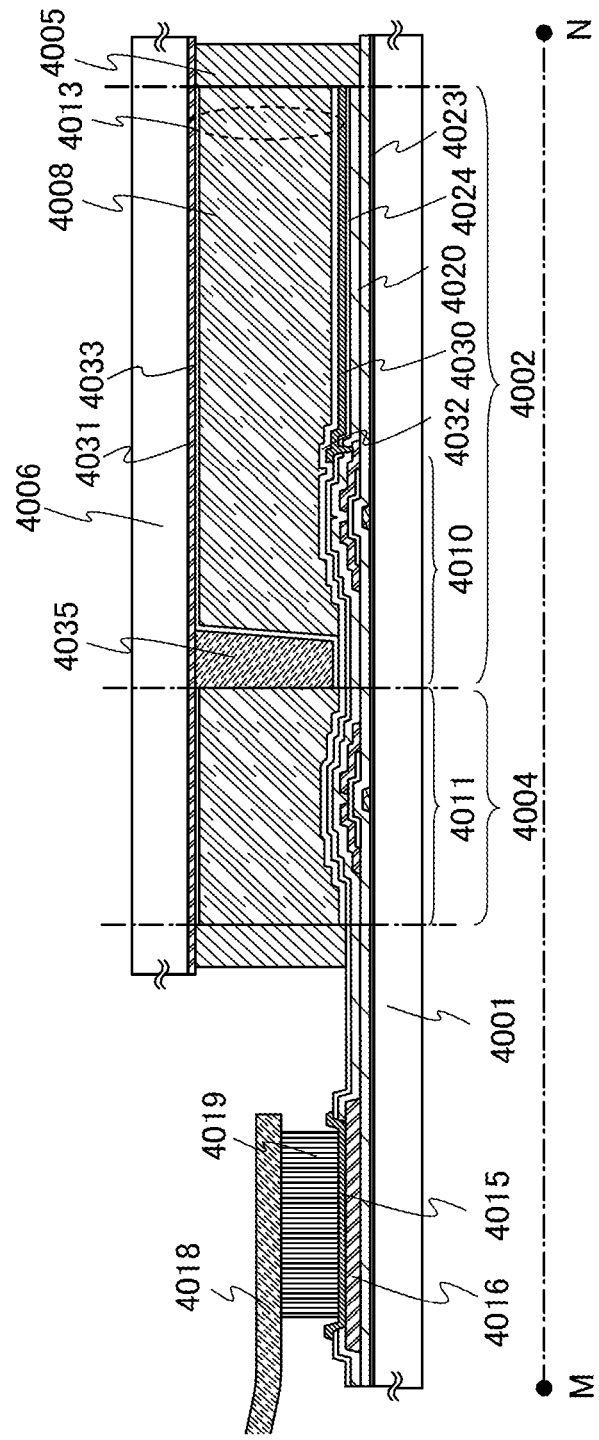
FIG. 11 is a view illustrating one embodiment of a display device.
Figure 12:
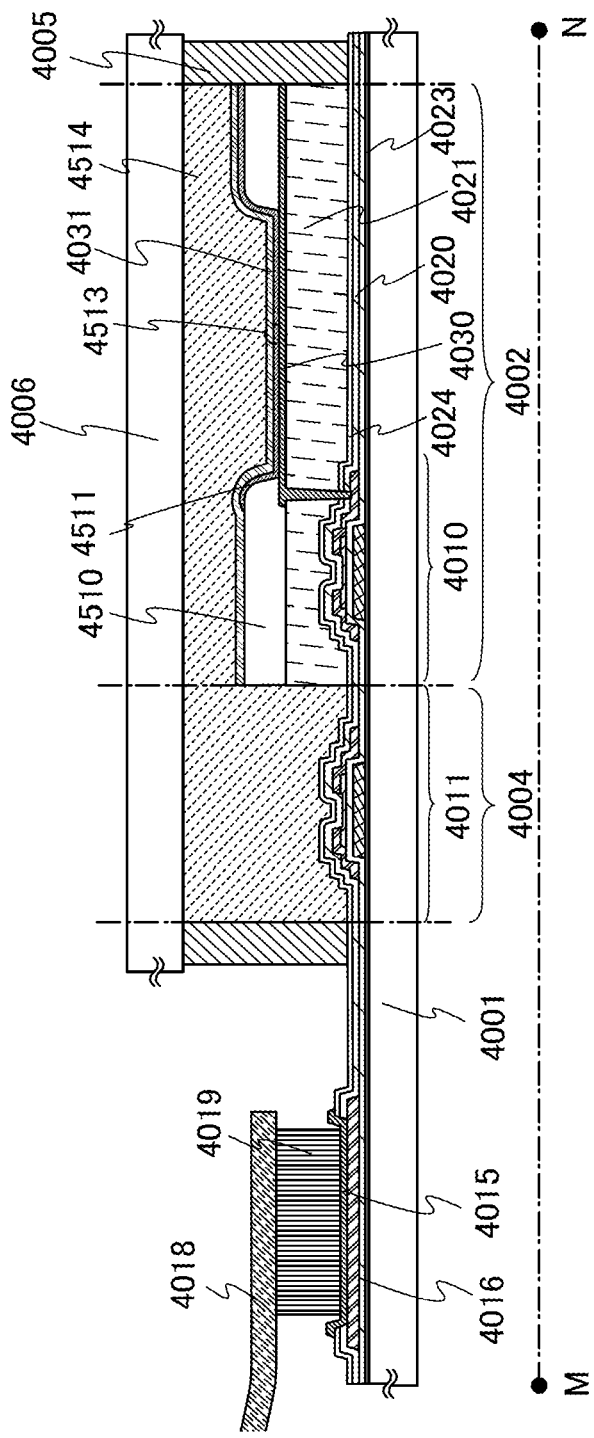
FIG. 12 is a view illustrating one embodiment of a display device.
Figure 13:
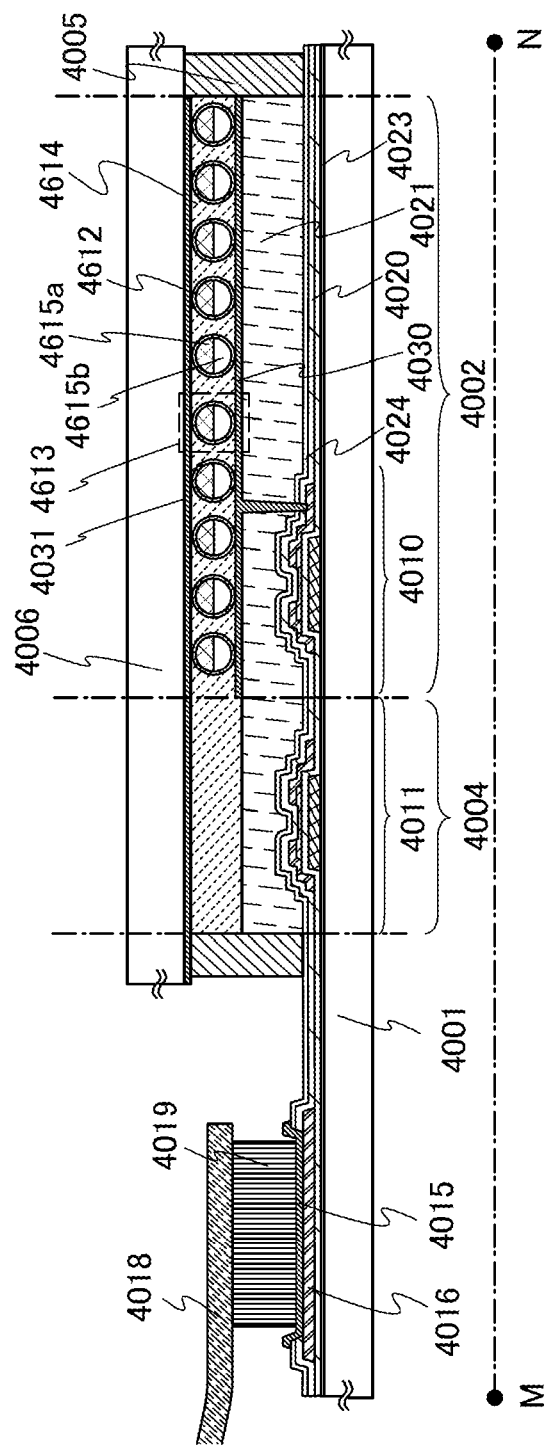
FIG. 13 is a view illustrating one embodiment of a display device.

One embodiment of a display device will be described with reference to FIGS. 11 to 13. FIGS. 11 to 13 correspond to cross-sectional views along line M-N in FIG. 10B.

As illustrated in FIGS. 11 to 13, the display device includes a connection terminal electrode 4015 and a terminal electrode 4016. The connection terminal electrode 4015 and the terminal electrode 4016 are electrically connected to a terminal provided for the FPC 4018 via an anisotropic conductive film 4019.

The connection terminal electrode 4015 is formed using the same conductive film as a first electrode layer 4030, and the terminal electrode 4016 is formed using the same conductive film as source and drain electrodes of transistors 4010 and 4011.

Each of the pixel portion 4002 and the scan line driver circuit 4004 which are provided over the first substrate 4001 includes a plurality of transistors. In FIGS. 11 to 13, the transistor 4010 included in the pixel portion 4002 and the transistor 4011 included in the scan line driver circuit 4004 are illustrated as an example. In FIG. 11, insulating films 4020 and 4024 are provided over the transistor 4010 and the transistor 4011. In FIGS. 12 and 13, an insulating layer 4021 is further provided. An insulating film 4023 is an insulating film serving as a base film.

In this embodiment, the shift register described in any one of Embodiments 1 and 2 can be applied to the scan line driver circuit 4004. With the transistor, power consumption of a driver circuit portion can be suppressed in the display device of this embodiment shown in FIGS. 11 to 13, and a flicker on a screen can be prevented.

The transistor 4010 included in the pixel portion 4002 is electrically connected to the display element, which is included in a display panel. There is no particular limitation on the kind of the display element as long as display can be performed; various kinds of display elements can be employed.

An example of a liquid crystal display device using a liquid crystal element as a display element is described in FIG. 11. In FIG. 11, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is provided therebetween. The second electrode layer 4031 is provided on the second substrate 4006 side, and the first electrode layer 4030 and the second electrode layer 4031 are stacked with the liquid crystal layer 4008 provided therebetween.

Reference numeral 4035 denotes a columnar spacer which is obtained by selective etching of an insulating film and is provided in order to control the thickness of the liquid crystal layer 4008 (a cell gap). The shape of the spacer is not limited to a columnar shape; a spherical spacer may be used, for example.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

Further, polymer dispersed liquid crystal (PDLC) and polymer network liquid crystal (PNLC) can be used without involving an alignment film. An example in which polymer liquid crystal is used for a liquid crystal layer is illustrated in FIG. 14.

Figure 14:
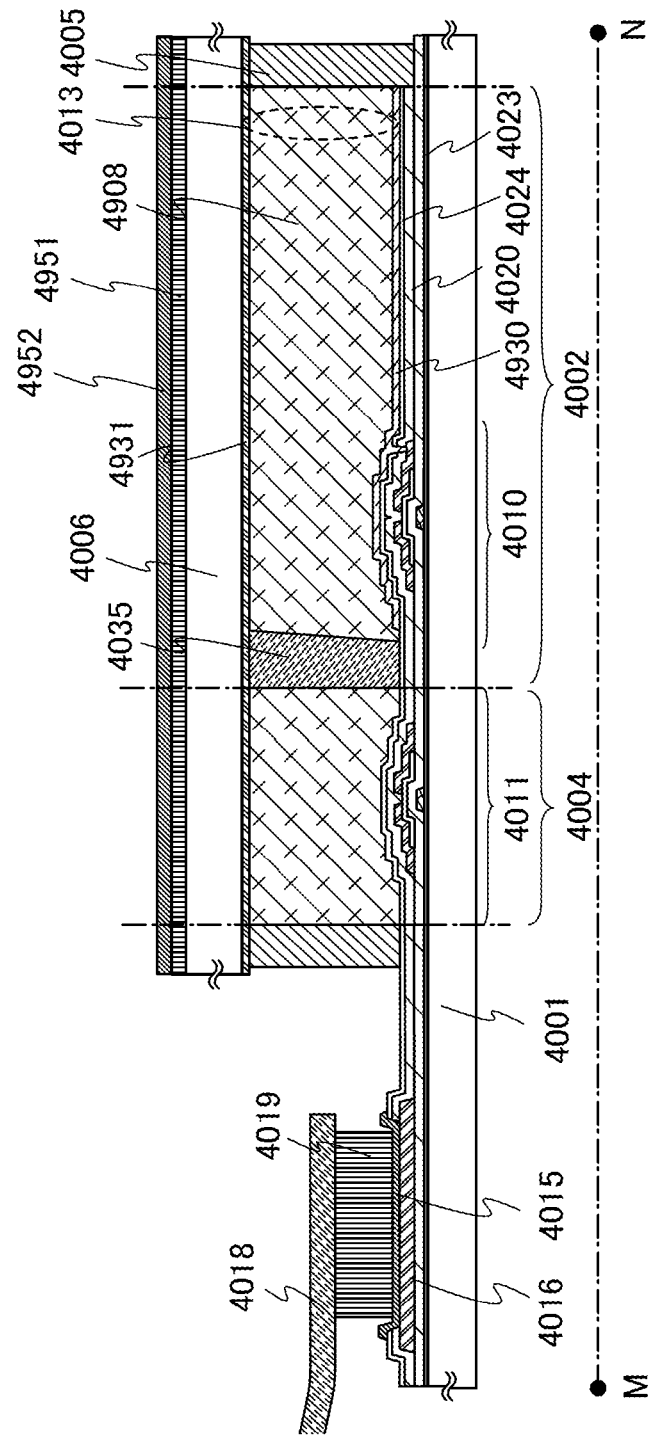
FIG. 14 is a view illustrating one embodiment of a display device.

A display device shown in FIG. 14 is a reflective liquid crystal display device in which the liquid crystal element 4013 provided between the first substrate 4001 and the second substrate 4006 includes a first electrode layer 4930 which has light-reflecting properties, a second electrode layer 4931 which has light-transmitting properties, and a liquid crystal layer 4908 using polymer dispersed liquid crystal. A retardation plate 4951 and a polarizing plate 4952 are provided on the outer side (on the side opposite to the liquid crystal layer 4908) of the second substrate 4006 which is a viewer side. The retardation plate 4951 and the polarizing plate 4952 are stacked to form a circularly polarizing plate.

White display (light display) is performed using scattered light by liquid crystal in the liquid crystal display device including the liquid crystal layer using polymer dispersed liquid crystal. In the liquid crystal layer 4908, liquid crystal particles are dispersed in a polymer layer forming macromolecular network.

When no voltage is applied between the first electrode layer 4930 and the second electrode layer 4931 (the case also called an OFF state), the liquid crystal particles dispersed in the polymer layer are oriented in a random manner in the liquid crystal layer 4908 to cause a difference between the refractive index of the polymer and the refractive index of the liquid crystal molecule, so that incident light is scattered by the liquid crystal particles. Therefore, since polarized incident light is scattered by the liquid crystal layer 4908 even when the polarizing plate 4952 is provided, light is passed through the polarizing plate 4952 and is emitted to the viewer side at a certain rate. Consequently, light display is viewed on the viewer side. In addition, the liquid crystal layer 4908 is made to be opaque and clouded, which prevents a reduction in visibility, such as glare even when a surface of the first electrode layer 4930 which has light-reflecting properties is a mirror plane.

On the other hand, when a voltage is applied between the first electrode layer 4930 and the second electrode layer 4931 (the case also called an ON state), an electric field is formed in the liquid crystal layer 4908 to arrange liquid crystal molecules in the liquid crystal particles in the direction of the electric field, so that the refractive index of the polymer almost coincides with the refractive index in the short axis of the liquid crystal molecules, and incident light thus transmits through the liquid crystal layer 4908 without being scattered by the liquid crystal particles. Therefore, the polarization of the incident light is controlled by the retardation plate 4951 and the polarizing plate 4952; in the case where a quarter-wave plate ($\lambda/4$ plate) is used as the retardation plate 4951, incident light is passed twice through the polarizing plate 4952 and the retardation plate 4951 before emission to the viewer side, which generates a phase change by ½ wave. Consequently, the incident light is absorbed in the polarizing plate 4952 at the time of emission, so that dark display is viewed on the viewer side.

The size of a storage capacitor provided in the liquid crystal display device is set considering the leakage current of the transistor provided in the pixel portion or the like so that charge can be retained for a predetermined period. In the case where the transistor including the high purity oxide semiconductor film is provided, it is enough to provide a storage capacitor having a capacitance that is ⅓ or less, preferably ⅕ or less of a liquid crystal capacitance of each pixel.

The shift register used in this embodiment enables display scan signals (ON signals or OFF signals) to be output at the same timing in a batch to a plurality of scan signal lines in the case of display with single color (e.g., all black or all white), which enables the data writing period to be decreased. Further, a period during which a scan signal line driver portion stops operating can be provided after a batch display, so that power consumption of the scan signal line driver portion can be reduced by the period. Further, high-speed operation can be realized, which enables a load on a driver circuit portion to be reduced, so that a flicker on the screen can be prevented.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be formed. The vertical alignment mode is a method of controlling alignment of liquid crystal molecules of a liquid crystal display panel, in which liquid crystal molecules are aligned perpendicularly to a panel surface when no voltage is applied. Some examples are given as the vertical alignment mode; for example, an MVA (multi-domain vertical alignment) mode, a PVA (patterned vertical alignment) mode, an ASV mode, or the like can be employed. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be provided with a polarizing substrate and a retardation substrate. In addition, a backlight, a side light, or the like may be used as a light source.

It is possible to employ a time-division display method (also called a field-sequential driving method) with the use of a plurality of light-emitting diodes (LEDs) as a backlight. A field-sequential driving method enables color display without using a color filter.

As a display method in the pixel portion, a progressive method, an interlace method, or the like can be employed. Further, color elements controlled in a pixel at the time of color display are not limited to three colors: R, G, and B (R, G, and B correspond to red, greed, and blue, respectively). For example, R, G, B, and W (W corresponds to white); R, G, B, and one or more of yellow, cyan, magenta, and the like; or the like can be used. Further, the sizes of display regions may be different between respective dots of color elements. An embodiment of the present invention is not limited to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to the ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which is further sandwiched between electrodes, and its light emission mechanism is localized type light emission that utilizes inner-shell electron transition of metal ions. Description in this embodiment is made using an organic EL element as a light-emitting element.

In order to extract light emitted from the light-emitting element, at least one of a pair of electrodes is transparent. A transistor and a light-emitting element are formed over a substrate. A light-emitting element having the following structure can be applied to the light-emitting element: a top emission structure in which light is extracted through the surface opposite to a substrate; a bottom emission structure in which light is extracted through the surface on a substrate side; or a dual emission structure in which light is extracted through the surface opposite to a substrate and the surface on the substrate side.

FIG. 12 illustrates an example of a light-emitting device using a light-emitting element as a display element. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated in FIG. 12. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening has a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon; polyvinyl chloride (PVC), acrylic, polyimide, epoxy resin, silicone resin, polyvinyl butyral (PVB), or ethylene vinyl acetate (EVA) can be used. For example, nitrogen is used as the filler.

In addition, if needed, an optical film such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by roughness on the surface so as to reduce the glare can be performed.

Further, an electronic paper in which electronic ink is driven can be provided as the display device. The electronic paper is also called an electrophoretic display device (electrophoretic display) and has advantages in that it exhibits the same level of readability as regular paper, it has less power consumption than other display devices, and it can thin and light in weight.

An electrophoretic display device can have various modes, and includes a plurality of microcapsules dispersed in a solvent or a solute, each including first particles which are positively charged and second particles which are negatively charged. By applying an electric field to the microcapsules, the particles in the microcapsules move in opposite directions to each other and display with the color of the particles gathering on one side is performed. The first particles and the second particles each contain pigment and do not move without an electric field. Moreover, the first particles and the second particles have different colors (either one of which may be colorless).

Thus, an electrophoretic display device is a display device that utilizes a so-called dielectrophoretic effect by which a substance having a high dielectric constant moves to a high-electric field region.

A solution in which the above plurality of microcapsules is dispersed in a solvent is referred to as electronic ink. This electronic ink can be printed on a surface of glass, plastic, cloth, paper, or the like. Furthermore, with a color filter or particles that have a pigment, color display can also be performed.

The first particles and the second particles in the microcapsules may each be formed using a single material selected from a conductive material, an insulating material, a semiconductor material, a magnetic material, a liquid crystal material, a ferroelectric material, an electroluminescent material, an electrochromic material, and a magnetophoretic material, or a composite material of any of these.

As the electronic paper, a display device using a twisting ball display system can be used. According to the twisting ball display system, spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

FIG. 13 illustrates active matrix electronic paper as one embodiment of a semiconductor device. The electronic paper in FIG. 13 is an example of a display device using a twisting ball display system.

Between the first electrode layer 4030 connected to the transistor 4010 and the second electrode layer 4031 provided for the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

In FIGS. 11 to 13, a flexible substrate as well as a glass substrate can be used as any of the first substrate 4001 and the second substrate 4006; a light-transmitting plastic substrate or the like can be used, for example. As the plastic substrate, a fiberglass-reinforced plastics (FRP) plate, a polyvinyl fluoride (PVF) film, a polyester film, or an acrylic resin film can be used. A sheet with a structure in which an aluminum foil is sandwiched between PVF films or polyester films can be used as well.

The insulating film 4020 can be formed using an inorganic insulating material such as silicon oxide, silicon oxynitride, hafnium oxide, aluminum oxide, or gallium oxide. A manufacturing method of the insulating film 4020 is not particularly limited; for example, a film formation method such as a plasma CVD method or a sputtering method can be used. A sputtering method is preferable in terms of low possibility of entry of hydrogen, water, and the like.

The insulating film 4024 can be formed to have a single-layer structure or a stacked-layer structure using one or more of a silicon nitride film, a silicon nitride oxide film, an aluminum oxide film, an aluminum nitride film, and an aluminum oxynitride film, and an aluminum nitride oxide film by a sputtering method. The insulating film 4024 functions as a protective film of a transistor.

The insulating layer 4021 can be formed using an inorganic insulating material or an organic insulating material. It is preferable that the insulating layer 4021 be formed using a heat-resistant organic insulating material such as an acrylic resin, polyimide, a benzocyclobutene-based resin, polyamide, or an epoxy resin, as a planarizing insulating film. Other than such an organic insulating material, it is possible to use a low-dielectric constant material (a low-k material), a siloxane-based resin, phosphosilicate glass (PSG), borophosphosilicate glass (BPSG), or the like. A plurality of insulating films formed using these materials may be stacked to form the insulating layer.

There is no particular limitation on the method for forming the insulating layer 4021; a sputtering method, a spin coating method, a dipping method, spray coating, a droplet discharge method (e.g., an inkjet method, screen printing, or offset printing), roll coating, curtain coating, knife coating, or the like can be used depending on a material of the insulating layer 4021.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (also called a pixel electrode layer, a common electrode layer, a counter electrode layer, or the like) for applying voltage to the display element each have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 can also be formed using one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

Since transistors are easily broken owing to static electricity or the like, a protective circuit for protecting a driver circuit is preferably provided. The protection circuit is preferably formed using a nonlinear element.

The shift register descried in any of Embodiments 1 and 2 can be applied as described above, display scan signals (ON signals or OFF signals) can be output at the same timing in a batch to a plurality of scan signal lines in the case of display with single color (e.g., all black or all white), which enables the data writing period to be decreased. Further, a period during which a scan signal line driver portion stops operating can be provided after a batch display, so that power consumption of the scan signal line driver portion can be reduced by the period. Further, high-speed operation can be realized, which enables a load on a driver circuit portion to be reduced, so that a flicker on the screen can be prevented.

Embodiment 5 can be implemented in appropriate combination with any other structure described in the other embodiments.

Embodiment 6

A liquid crystal display device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 15A:
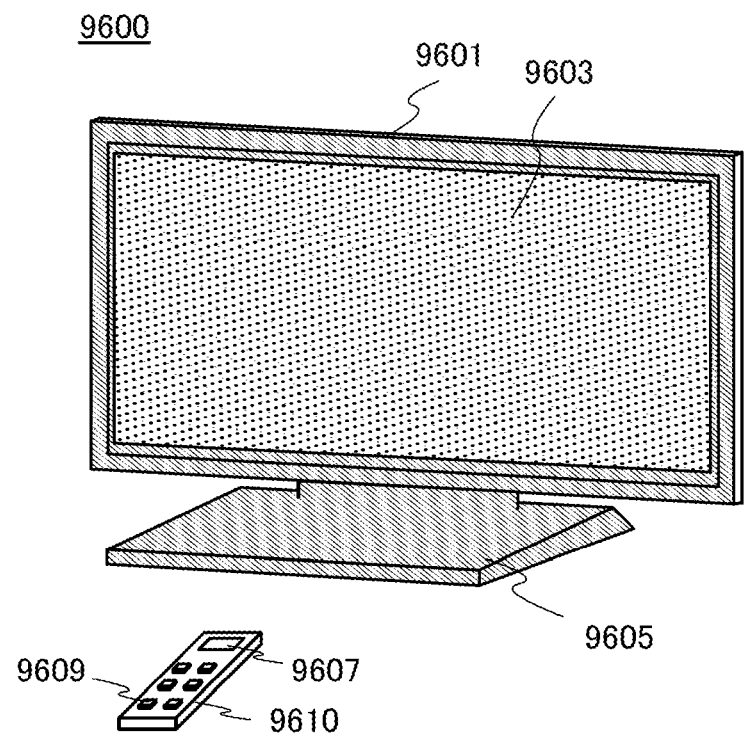
FIGS. 15A and 15B are views illustrating electronic devices.

FIG. 15A illustrates an example of a television set. In a television set 9600, a display portion 9603 is incorporated in a housing 9601. Images can be displayed on the display portion 9603. In this example, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. The remote controller 9610 may be provided with a display portion 9607 for displaying data output from the remote controller 9610.

The television set 9600 is provided with a receiver, a modem, and the like. With the use of the receiver, general television broadcasting can be received. Moreover, a communication network can be connected with or without wires via the modem, so that one-way (from a sender to a receiver) or two-way (between a sender and a receiver or between receivers) data communication can be performed.

Figure 15B:
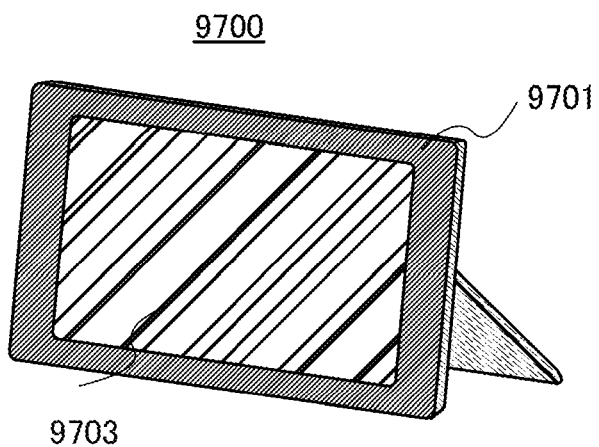

FIG. 15B illustrates an example of a digital photo frame. For example, in a digital photo frame 9700, a display portion 9703 is incorporated in a housing 9701. A variety of images can be displayed on the display portion 9703. For example, the display portion 9703 can display data of an image taken with a digital camera or the like can be displayed on the display portion 9703, whereby the digital photo frame 9700 can be functioned as a normal photo frame.

The digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide on the side surface or the back surface for the design of the digital photo frame 9700. For example, a memory in which image data taken with a digital camera is stored is inserted in the recording medium insertion portion of the digital photo frame 9700, whereby the image data can be displayed on the display portion 9703.

The digital photo frame 9700 may be configured to transmit and receive data wirelessly. The structure may be employed in which image data is taken in wirelessly to be displayed.

Figure 16A:
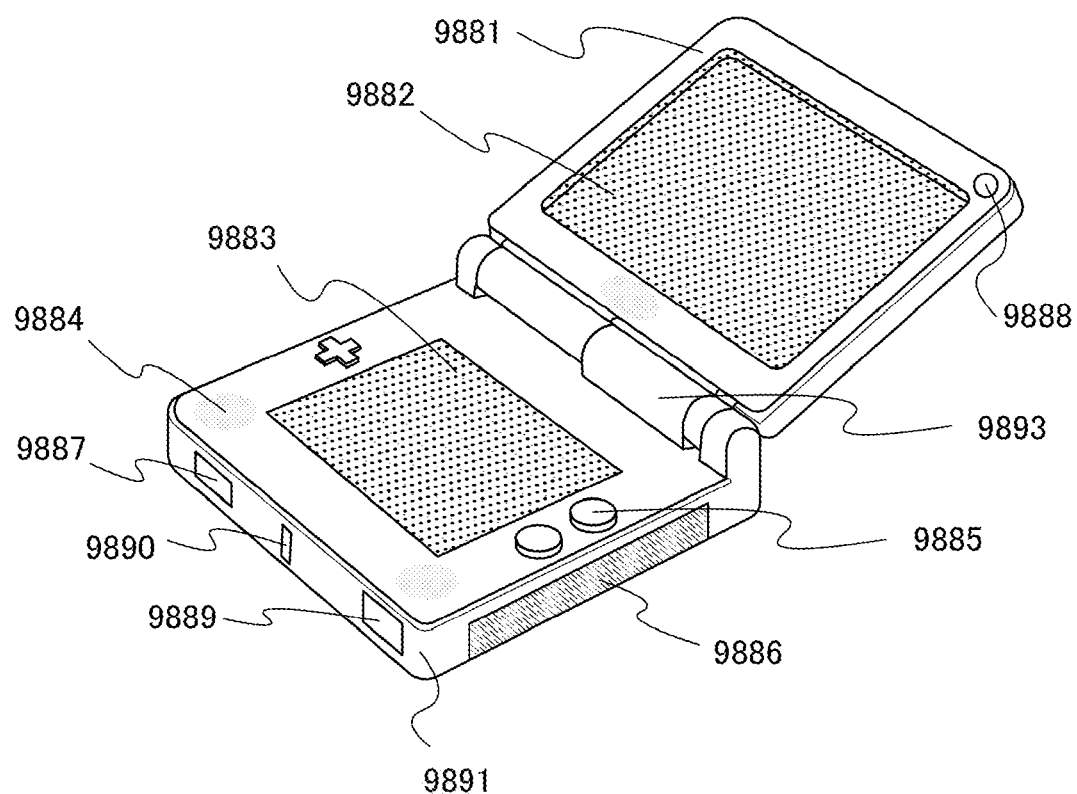
FIGS. 16A and 16B are views illustrating electronic devices.

FIG. 16A is a portable amusement machine and includes two housings, a housing 9881 and a housing 9891, which are connected with a joint portion 9893 so that the portable amusement machine can be opened or folded. A display portion 9882 and a display portion 9883 are incorporated in the housing 9881 and the housing 9891, respectively. In addition, the portable amusement machine illustrated in FIG. 16A is also provided for a speaker portion 9884, a recording medium insertion portion 9886, an LED lamp 9890, an input means (an operation key) 9885, a connection terminal 9887, a sensor 9888 (a sensor for measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9889, or the like. Needless to say, the structure of the portable amusement machine is not limited to the above, and may be any structure which is provided with at least a liquid crystal display device disclosed in this specification. In addition, another accessory may be provided as appropriate. The portable amusement machine illustrated in FIG. 16A is equipped with a function of reading a program or data stored in a recording medium to display on the display portion, and/or a function of sharing information with another portable amusement machine by wireless communication. The portable amusement machine illustrated in FIG. 16A can have various functions without limitation to the above.

Figure 16B:
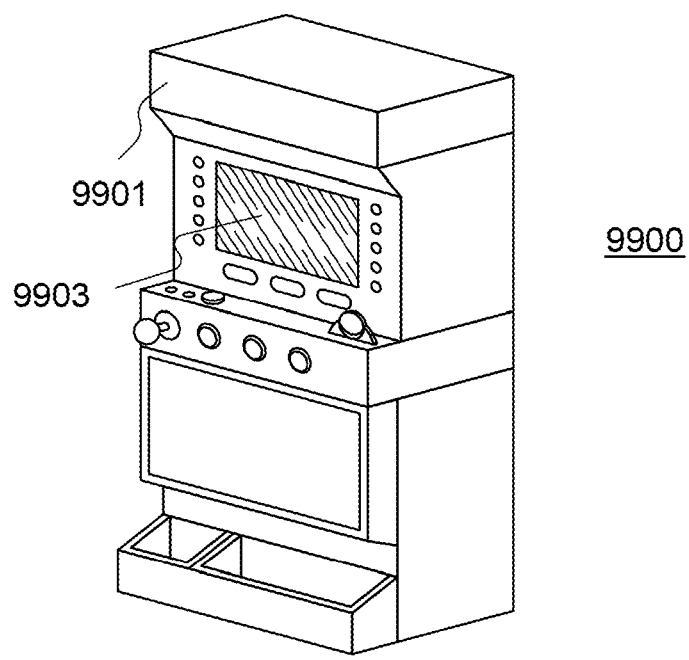

FIG. 16B illustrates an example of a slot machine which is a large-sized amusement machine. In a slot machine 9900, a display portion 9903 is incorporated in a housing 9901. In addition, the slot machine 9900 is provided with an operation means such as a start lever or a stop switch, a coin slot, a speaker, and the like. Needless to say, the structure of the slot machine 9900 is not limited to the above, and may be any structure which is provided with at least a liquid crystal display device disclosed in this specification. In addition, another accessory may be provided as appropriate.

Figure 17A:
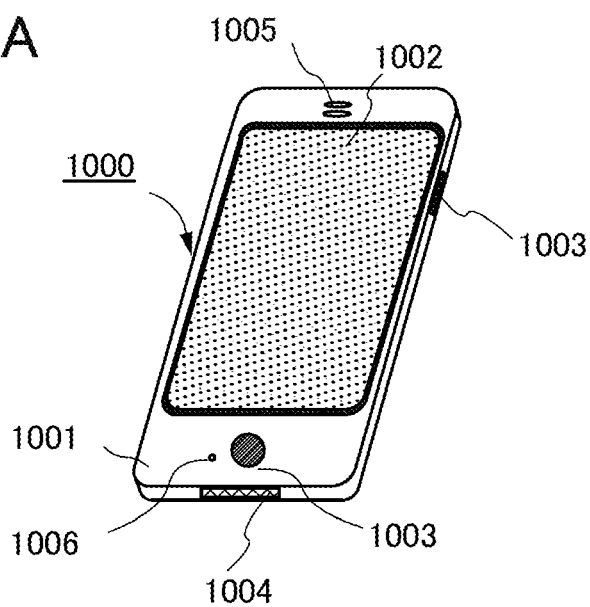
FIGS. 17A and 17B are views illustrating electronic devices.

FIG. 17A illustrates an example of a mobile phone. A mobile phone 1000 is provided with a display portion 1002 incorporated in a housing 1001, an operation button 1003, an external connection port 1004, a speaker 1005, a microphone 1006, and the like.

The display portion 1002 of the mobile phone 1000 illustrated in FIG. 17A can be touched with a finger or the like, whereby data can be input to the mobile phone 1000. Users can make a call or text messaging by touching the display portion 1002 with their fingers or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on the screen can be input. In that case, it is preferable to display a keyboard or number buttons on almost all area of the screen of the display portion 1002.

Further, a detection device having a sensor for detecting inclination, such as a gyroscope or an acceleration sensor, can be provided inside the mobile phone 1000, so that the installation direction of the mobile phone 1000 (whether the mobile phone 1000 is placed horizontally or vertically for a landscape mode or a portrait mode) can be determined to automatically switch display on the screen of the display portion 1002.

The screen modes are switched by touching the display portion 1002 or operating the operation button 1003 of the housing 1001. The screen modes may be switched depending on the kind of an image displayed on the display portion 1002. For example, when a signal of an image displayed on the display portion is a signal of moving image data, the screen mode is switched to the display mode; when the signal is a signal of text data, the screen mode is switched to the input mode.

Further, in the input mode, when input with a touch to the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken by touching the display portion 1002 with the palm or the finger, whereby personal authentication can be performed. Further, by providing a backlight or a sensing light source which emits near-infrared light in the display portion 1002, an image of a finger vein, a palm vein, or the like can be taken.

Figure 17B:
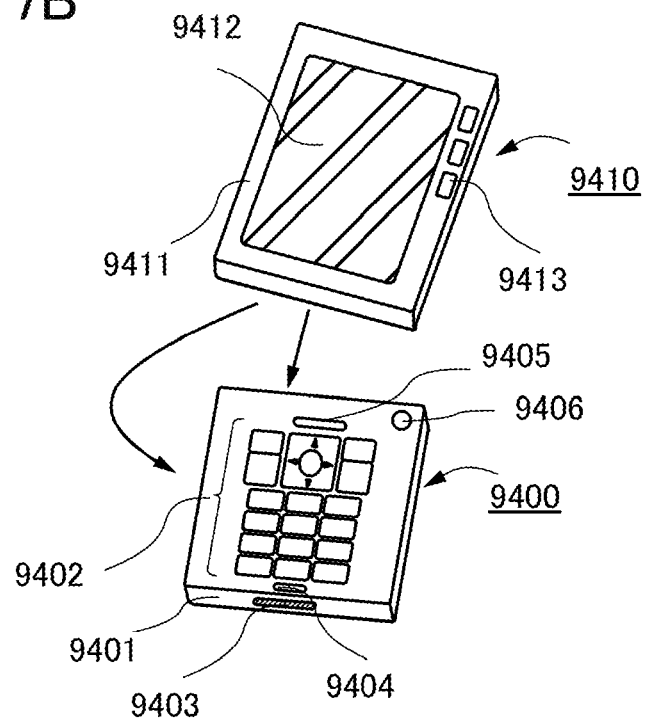

FIG. 17B also illustrates an example of a mobile phone. A mobile phone in FIG. 17B has a display device 9410 provided for a housing 9411, which includes a display portion 9412 and operation buttons 9413, and a communication device 9400 provided for a housing 9401, which includes operation buttons 9402, an external input terminal 9403, a microphone 9404, a speaker 9405, and a light-emitting portion 9406 that emits light when a phone call is received. The display device 9410 having a display function can be detached from and attached to the communication device 9400 which has a telephone function in two directions indicated by arrows. Therefore, respective short axes of the display device 9410 and the communication device 9400 can be connected to each other; alternatively, respective long axes of the display device 9410 and the communication device 9400 can be connected to each other. In addition, when only the display function is used, the display device 9410 can be detached from the communication device 9400 and used alone. Images or input data can be transmitted and received by wireless or wire communication between the communication device 9400 and the display device 9410, each of which has a rechargeable battery.

EXPLANATION OF REFERENCE

10: pulse output circuit; 11: signal line; 12: signal line; 13: signal line; 14: signal line; 21: input terminal; 22: input terminal; 23: input terminal; 24: input terminal; 25: output terminal; 26: input terminal; 27: output terminal; 31: power source line; 32: power source line; 33: power source line; 34: power source line; 35: power source line; 36: power source line; 37: power source line; 38: power source line; 51: period; 52: period; 53: period; 54: period; 55: period; 60: control portion; 70: output portion; 100: transistor; 101: transistor; 102: transistor; 103: transistor; 104: transistor; 105: transistor; 106: transistor; 107: transistor; 108: transistor; 109: transistor; 110: transistor; 111: transistor; 400: substrate; 401: gate electrode layer; 402: gate insulating layer; 403: oxide semiconductor layer; 407: insulating film; 409: protective insulating layer; 410: transistor; 420: transistor; 427: insulating layer; 430: transistor; 437: insulating layer; 440: transistor; 505: substrate; 506: protective insulating layer; 507: gate insulating layer; 510: transistor; 511: gate electrode layer; 516: insulating layer; 530: oxide semiconductor film; 531: oxide semiconductor layer; 1000: mobile phone; 1001: housing; 1002: display portion; 1003: operation button; 1004: external connection port; 1005: speaker portion; 1006: microphone; 4001: substrate; 4002: pixel portion; 4003: signal line driver circuit; 4004: scan line driver circuit; 4005: sealant; 4006: substrate; 4008: liquid crystal layer; 4010: transistor; 4011: transistor; 4013: liquid crystal element; 4015: connection terminal electrode; 4016: terminal electrode; 4018: FPC; 4019: anisotropic conductive film; 4020: insulating film; 4021: insulating layer; 4023: insulating film; 4024: insulating film; 4030: electrode layer; 4031: electrode layer; 4032: insulating film; 405a: source electrode layer; 405b: drain electrode layer; 436a: wiring layer; 436b: wiring layer; 4510: partition wall; 4511: electroluminescence layer; 4513: light-emitting element; 4514: sealant; 4612: cavity; 4613: spherical particle; 4614: sealant; 4908: liquid crystal layer; 4930: electrode layer; 4931: electrode layer; 4951: retardation plate; 4952: polarizing plate; 515a: source electrode layer; 515b: drain electrode layer; 9400: communication device; 9401: housing; 9402: operation button; 9403: external input terminal; 9404: microphone; 9405: speaker portion; 9406: light-emitting portion; 9410: display device; 9411: housing; 9412: display portion; 9413: operation button; 9600: television set; 9601: housing; 9603: display portion; 9605: stand; 9607: display portion; 9609: operation key; 9610: remote controller; 9700: digital photo frame; 9701: housing; 9703: display portion; 9881: housing; 9882: display portion; 9883: display portion; 9884: speaker portion; 9885: input means (operation key); 9886: recording medium insertion portion; 9887: connection terminal; 9888: sensor; 9889: microphone; 9890: LED lamp; 9891: housing; 9893: joint portion; 9900: slot machine; 9901: housing; 9903: display portion; 4018a: FPC; 4018b: FPC; 4615a: black region; 4615b: white region This application is based on Japanese Patent Application serial no. 2010-117615 filed with Japan Patent Office on May 21, 2010, the entire contents of which are hereby incorporated by reference.

The invention claimed is:

1. A semiconductor device comprising:
 a first transistor, a second transistor, a third transistor, a fourth transistor, a fifth transistor, a sixth transistor, a seventh transistor, an eighth transistor, and a ninth transistor,
 wherein one of a source and a drain of the first transistor and one of a source and a drain of the second transistor are electrically connected to a first output terminal,
 wherein a gate of the first transistor, a gate of the fifth transistor, and one of a source and a drain of the seventh transistor are electrically connected with each other,
 wherein a gate of the second transistor, a gate of the third transistor, one of a source and a drain of the fourth transistor, a gate of the sixth transistor, and one of a source and a drain of the ninth transistor are electrically connected with each other,
 wherein one of a source and a drain of the third transistor, the other of the source and the drain of the seventh transistor, and one of a source and a drain of the eighth transistor are electrically connected with each other,
 wherein the other of the source and the drain of the seventh transistor and the one of the source and the drain of the eighth transistor are directly connected with each other,
 wherein a gate of the fourth transistor and a gate of the eighth transistor are electrically connected with each other, and
 wherein one of a source and a drain of the fifth transistor and one of a source and a drain of the sixth transistor are electrically connected to a second output terminal.

2. A semiconductor device comprising:
a first transistor, a second transistor, a third transistor, a fourth transistor, a fifth transistor, a sixth transistor, a seventh transistor, an eighth transistor, and a ninth transistor,
wherein one of a source and a drain of the first transistor and one of a source and a drain of the second transistor are electrically connected to a first output terminal,
wherein a gate of the first transistor, a gate of the fifth transistor, and one of a source and a drain of the seventh transistor are electrically connected with each other,
wherein a gate of the second transistor, a gate of the third transistor, one of a source and a drain of the fourth transistor, a gate of the sixth transistor, and one of a source and a drain of the ninth transistor are electrically connected with each other,
wherein one of a source and a drain of the third transistor, the other of the source and the drain of the seventh transistor, and one of a source and a drain of the eighth transistor are electrically connected with each other,
wherein the other of the source and the drain of the seventh transistor and the one of the source and the drain of the eighth transistor are directly connected with each other,
wherein a gate of the fourth transistor and a gate of the eighth transistor are electrically connected with each other,
wherein one of a source and a drain of the fifth transistor and one of a source and a drain of the sixth transistor are electrically connected to a second output terminal,
wherein the other of the source and the drain of the second transistor is electrically connected to a first power source line, and
wherein the other of the source and the drain of the third transistor and the other of the source and the drain of the fourth transistor are electrically connected to a second power source line.

3. A semiconductor device comprising:
a first transistor, a second transistor, a third transistor, a fourth transistor, a fifth transistor, a sixth transistor, a seventh transistor, an eighth transistor, and a ninth transistor,
wherein one of a source and a drain of the first transistor and one of a source and a drain of the second transistor are electrically connected to a first output terminal,
wherein a gate of the first transistor, a gate of the fifth transistor, and one of a source and a drain of the seventh transistor are electrically connected with each other,
wherein a gate of the second transistor, a gate of the third transistor, one of a source and a drain of the fourth transistor, a gate of the sixth transistor, and one of a source and a drain of the ninth transistor are electrically connected with each other,
wherein one of a source and a drain of the third transistor, the other of the source and the drain of the seventh transistor, and one of a source and a drain of the eighth transistor are electrically connected with each other,
wherein the other of the source and the drain of the seventh transistor and the one of the source and the drain of the eighth transistor are directly connected with each other, and
wherein one of a source and a drain of the fifth transistor and one of a source and a drain of the sixth transistor are electrically connected to a second output terminal.

\* \* \* \* \*